United States Patent
Wakamatsu et al.

(10) Patent No.: US 9,779,983 B2
(45) Date of Patent: Oct. 3, 2017

(54) METHODS FOR FORMING AIR GAPS IN SHALLOW TRENCH ISOLATION TRENCHES FOR NAND MEMORY

(71) Applicant: SANDISK TECHNOLOGIES INC., Plano, TX (US)

(72) Inventors: Oshi Wakamatsu, Yokkaichi (JP); Yasuhiro Domae, Yokkaichi (JP)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/723,490

(22) Filed: May 28, 2015

(65) Prior Publication Data

US 2016/0351435 A1    Dec. 1, 2016

(51) Int. Cl.
| | | |
|---|---|---|
| *H01L 29/788* | (2006.01) | |
| *H01L 21/764* | (2006.01) | |
| *H01L 27/11524* | (2017.01) | |
| *H01L 21/762* | (2006.01) | |

(52) U.S. Cl.
CPC ...... *H01L 21/764* (2013.01); *H01L 21/76224* (2013.01); *H01L 27/11524* (2013.01)

(58) Field of Classification Search
CPC ............... H01L 27/0207; H01L 23/528; H01L 27/1122; H01L 27/11206
USPC ........................................................ 257/315
See application file for complete search history.

(56) References Cited

U.S. PATENT DOCUMENTS

| | | | | |
|---|---|---|---|---|
| 2010/0173470 A1* | 7/2010 | Lee | ....................... | C09D 183/02 438/427 |
| 2011/0084320 A1* | 4/2011 | Jung | .................. | H01L 21/28512 257/288 |
| 2012/0104485 A1* | 5/2012 | Yang | ...................... | H01L 21/764 257/324 |
| 2012/0326225 A1* | 12/2012 | Chang | ................... | H01L 29/792 257/326 |
| 2014/0042513 A1* | 2/2014 | Naito | ...................... | H01L 29/78 257/314 |
| 2014/0042518 A1* | 2/2014 | Shim | ................. | H01L 29/42328 257/321 |
| 2014/0117459 A1* | 5/2014 | Kim | .................. | H01L 27/10876 257/401 |
| 2014/0239368 A1* | 8/2014 | Sakaguchi | ........ | H01L 21/76224 257/321 |
| 2014/0248754 A1* | 9/2014 | Thadani | .............. | H01L 21/2015 438/422 |
| 2014/0252434 A1* | 9/2014 | Lee | ................... | H01L 21/76224 257/288 |
| 2015/0236028 A1* | 8/2015 | Oh | .................... | H01L 27/11517 257/316 |

* cited by examiner

*Primary Examiner* — Phat X Cao
*Assistant Examiner* — Mohammad M Hoque
(74) *Attorney, Agent, or Firm* — Vierra Magen Marcus LLP

(57) ABSTRACT

A method of forming a shallow trench isolation trench in a semiconductor substrate is described. The method includes forming a trench in a region of the substrate, forming a first dielectric material in the trench, forming a second dielectric material above the first dielectric material, forming a first air gap in the first dielectric material in the trench, and forming a second air gap in the second dielectric material above the first air gap.

14 Claims, 48 Drawing Sheets

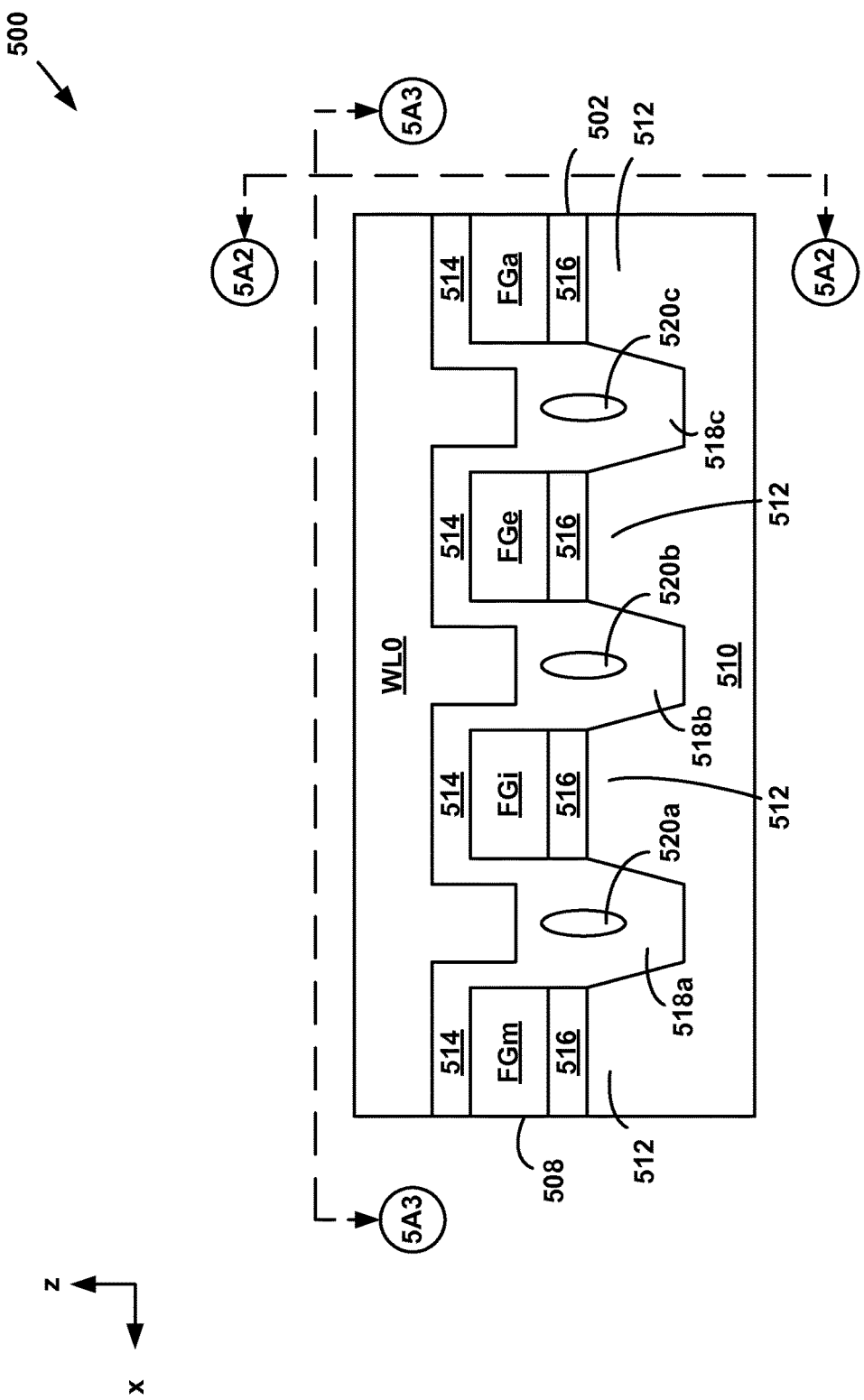

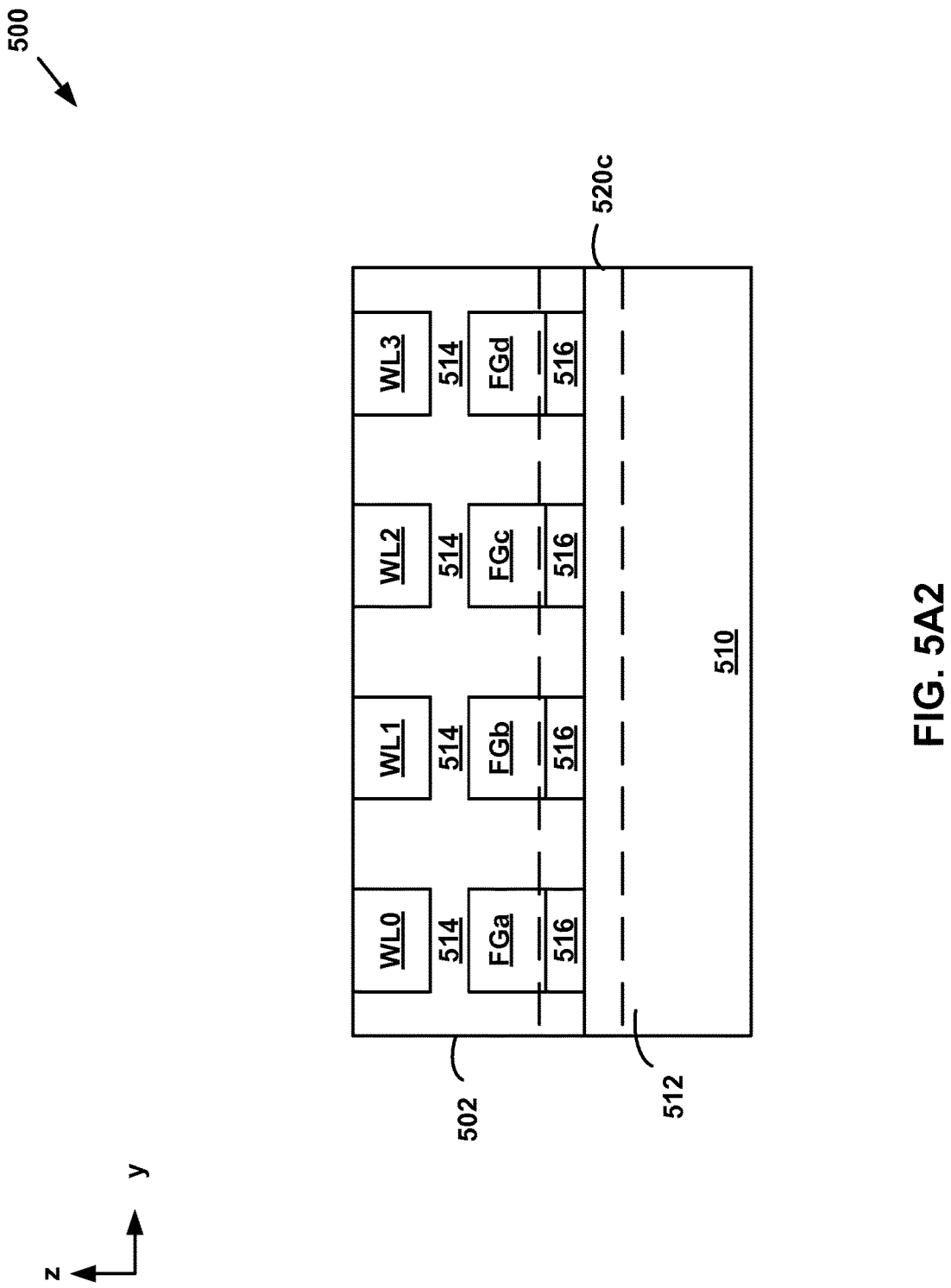
FIG. 5A2

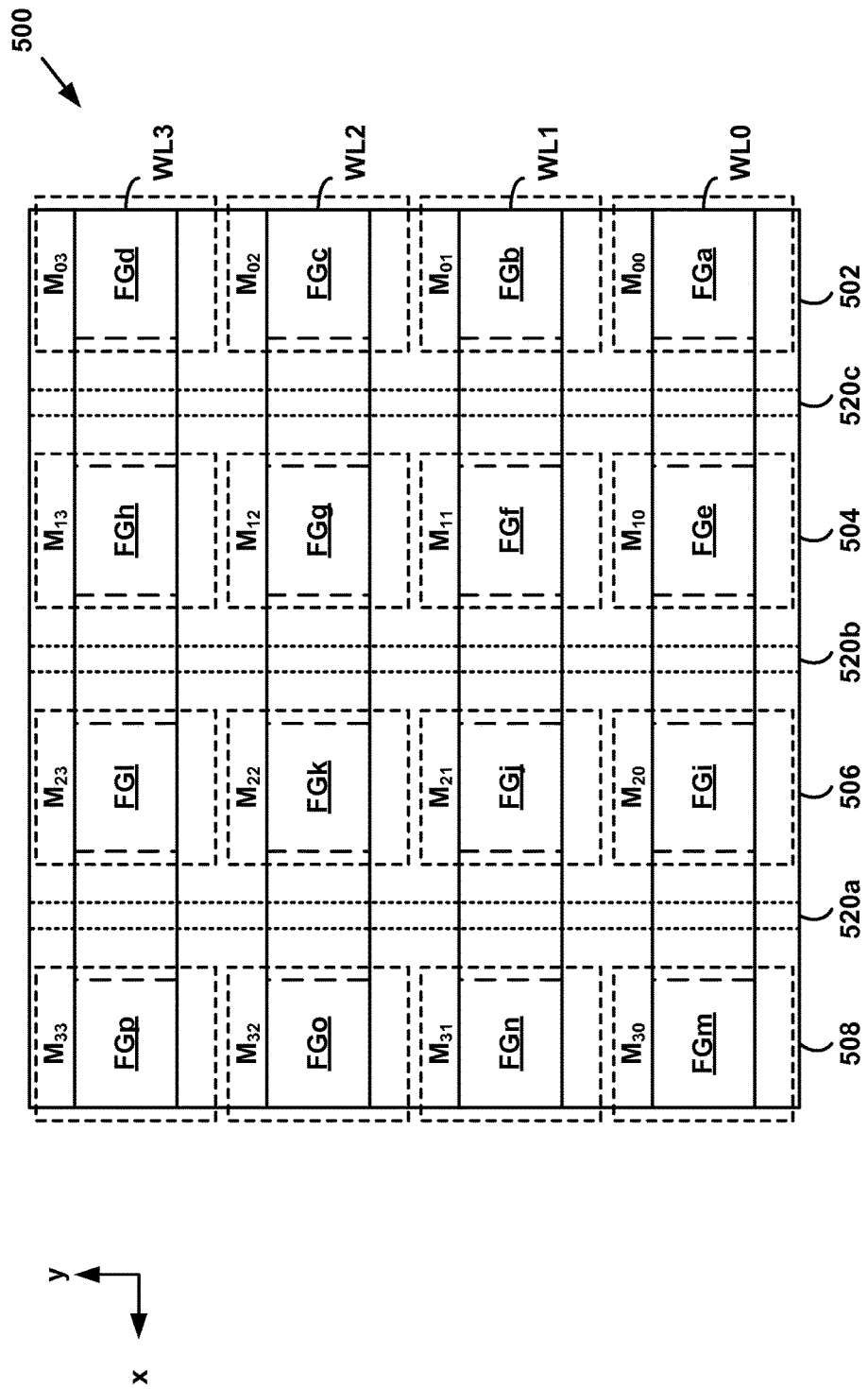
FIG. 5A3

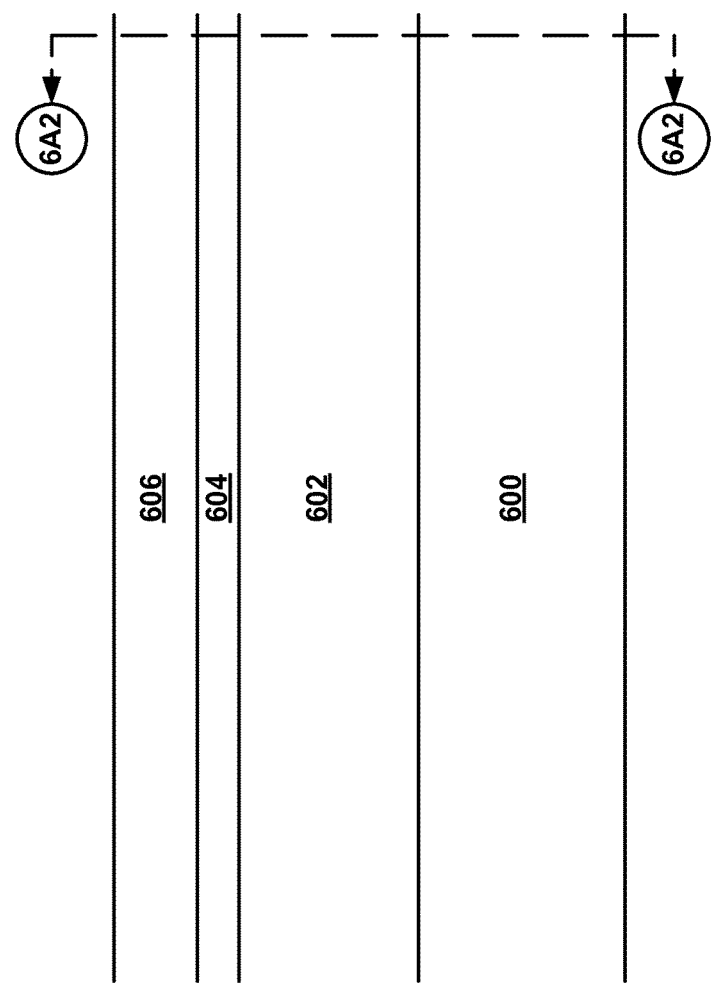
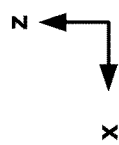
FIG. 6A1

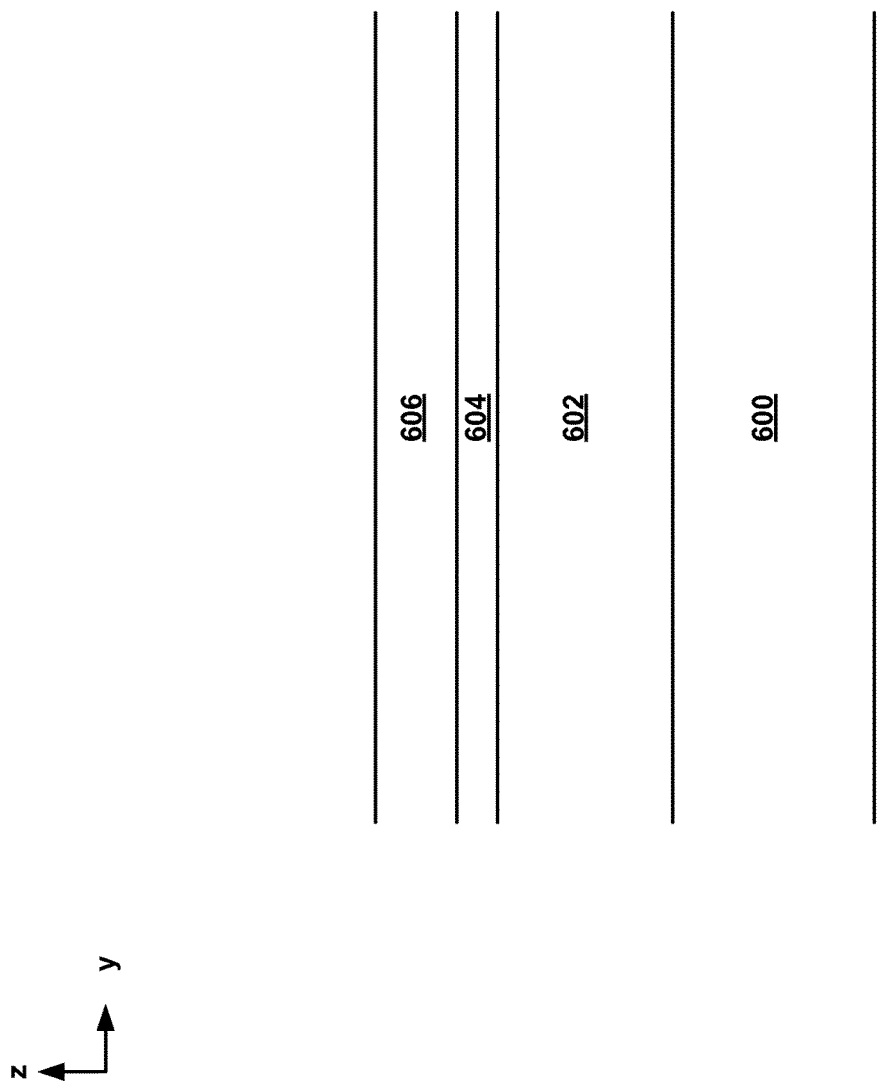

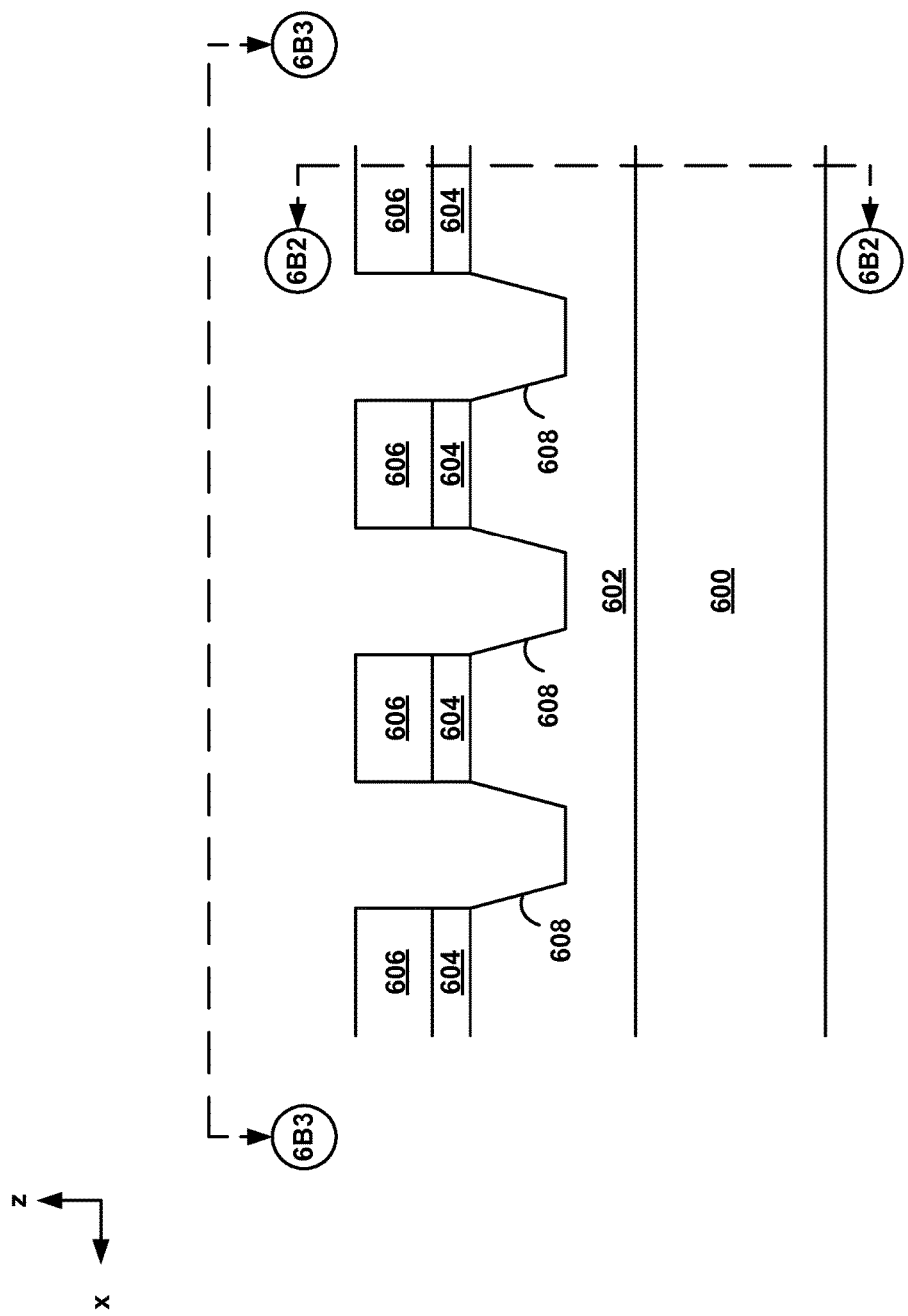

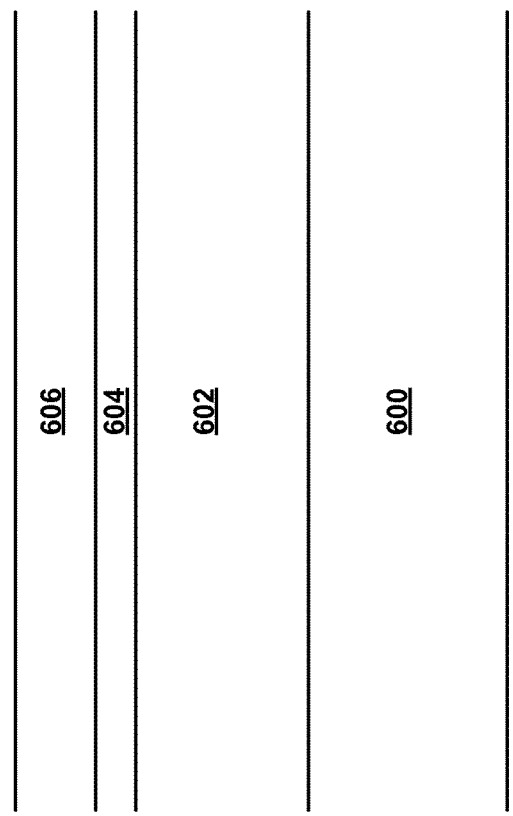
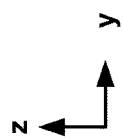

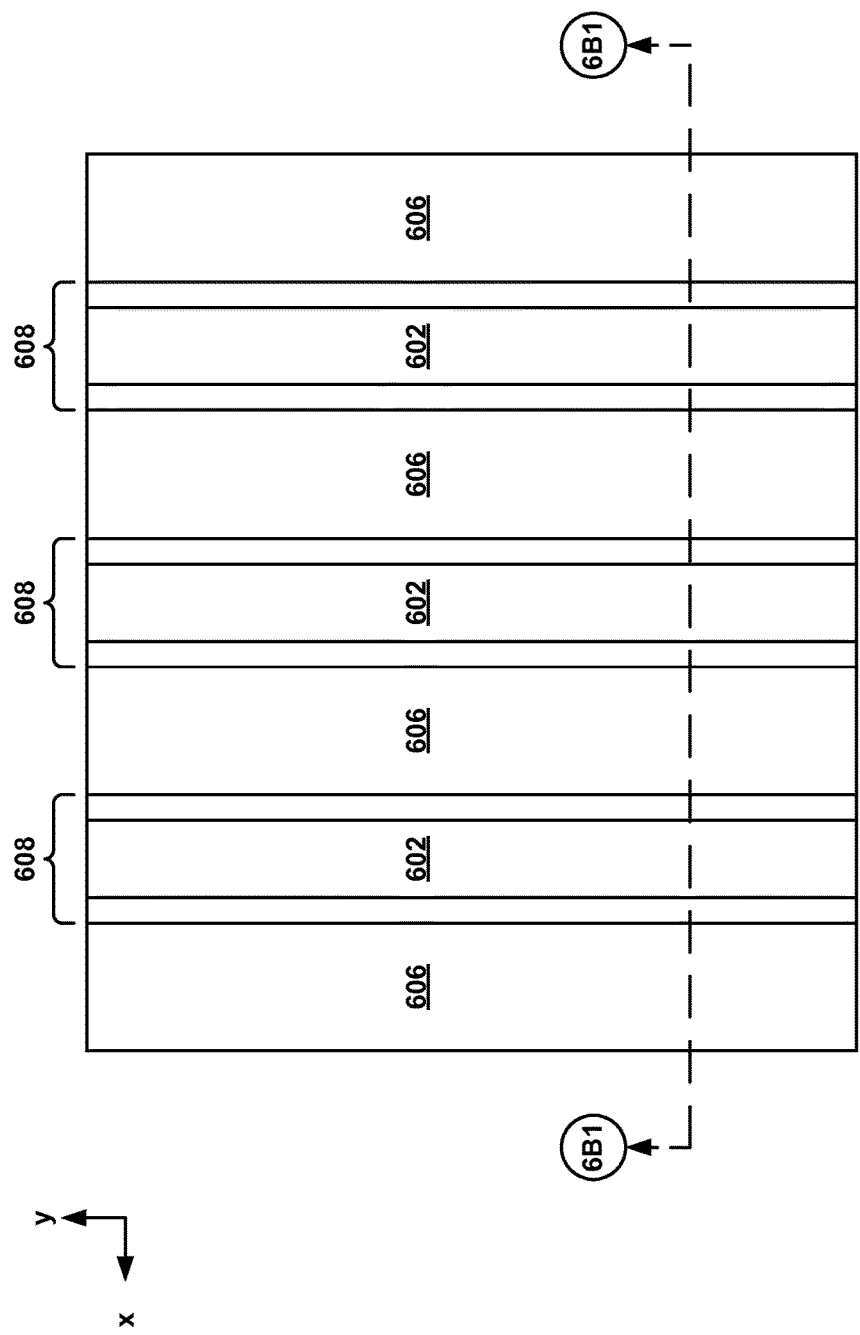

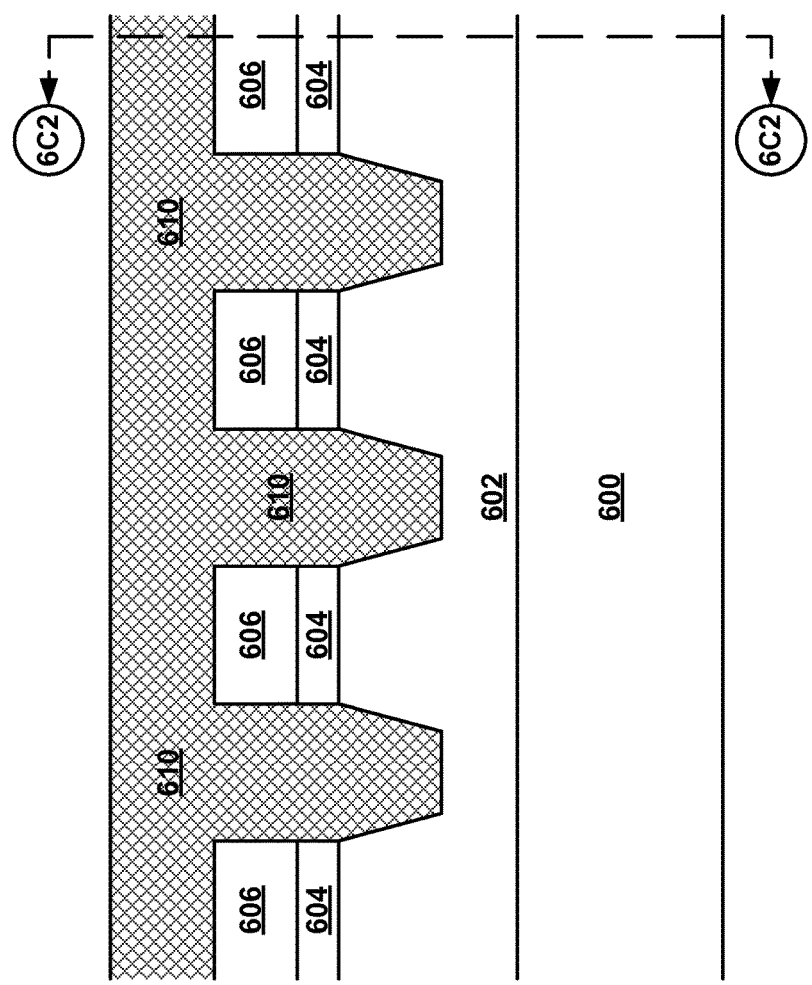
FIG. 6C1

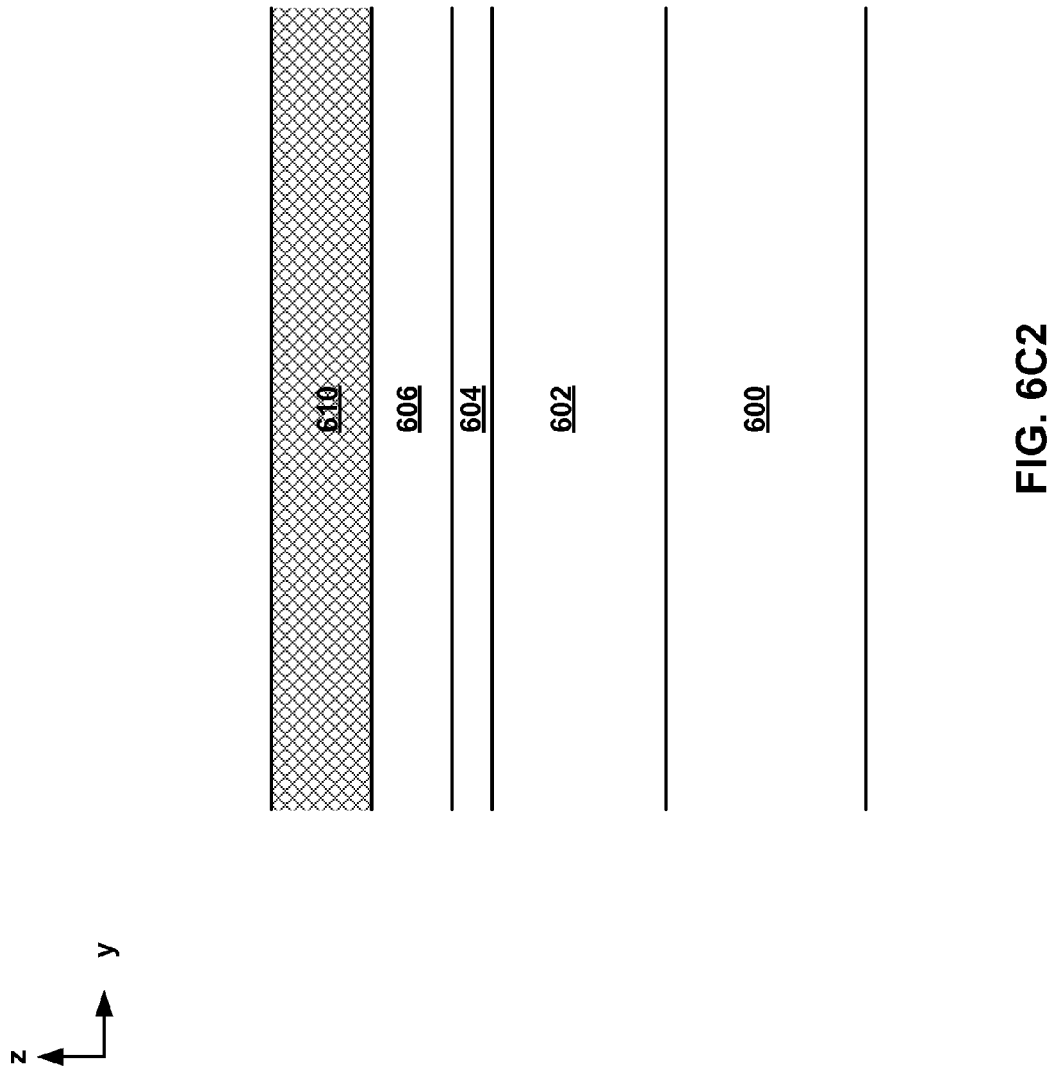

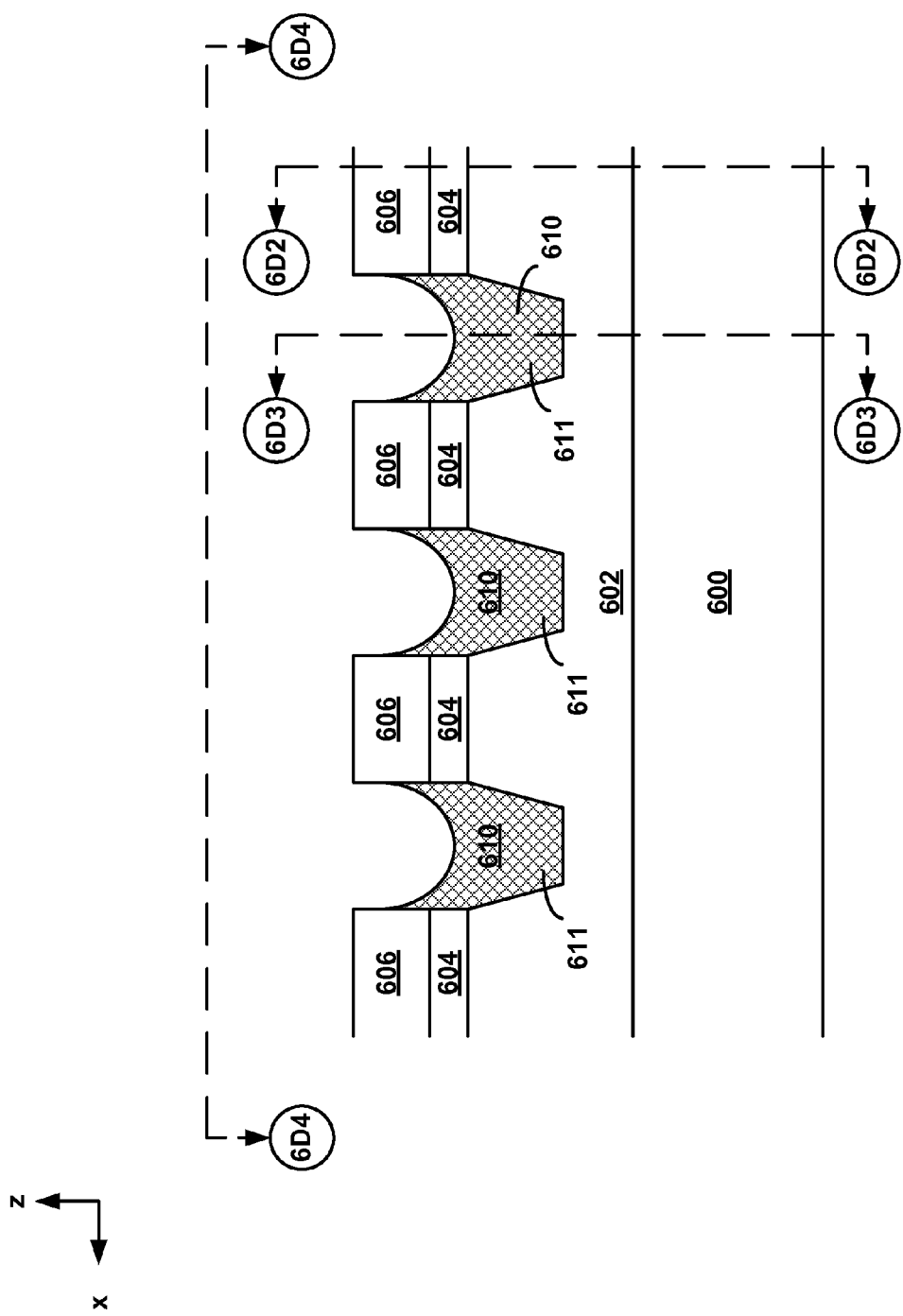

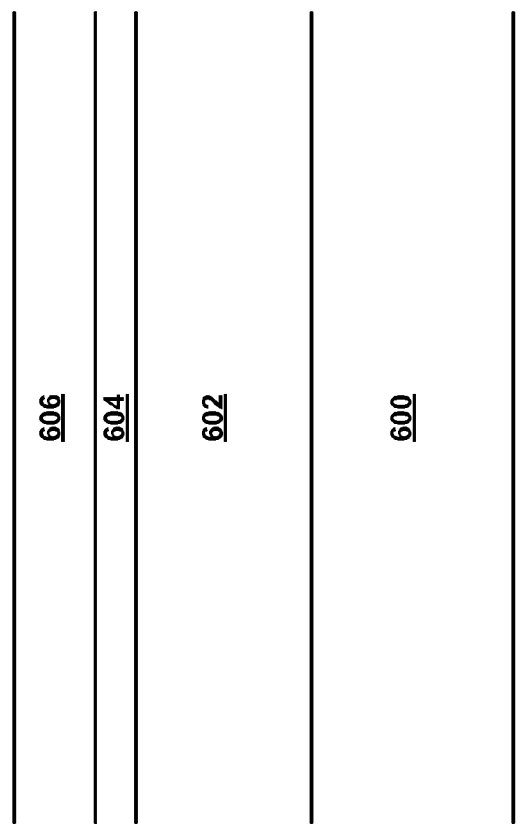
FIG. 6D2

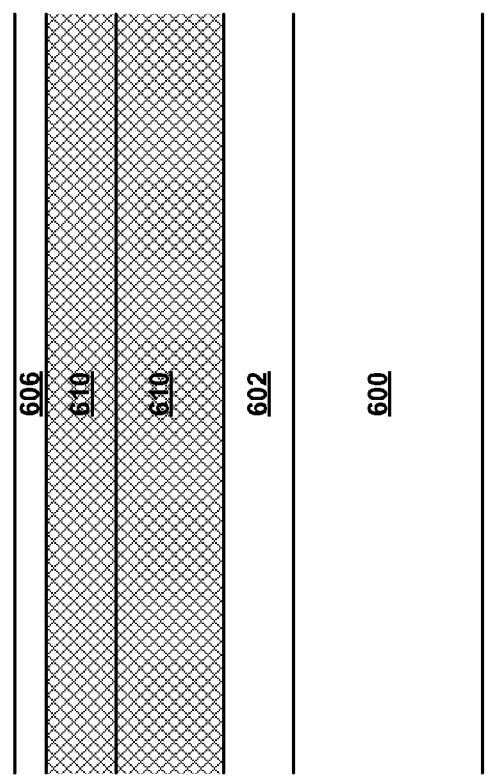
FIG. 6D3
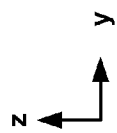

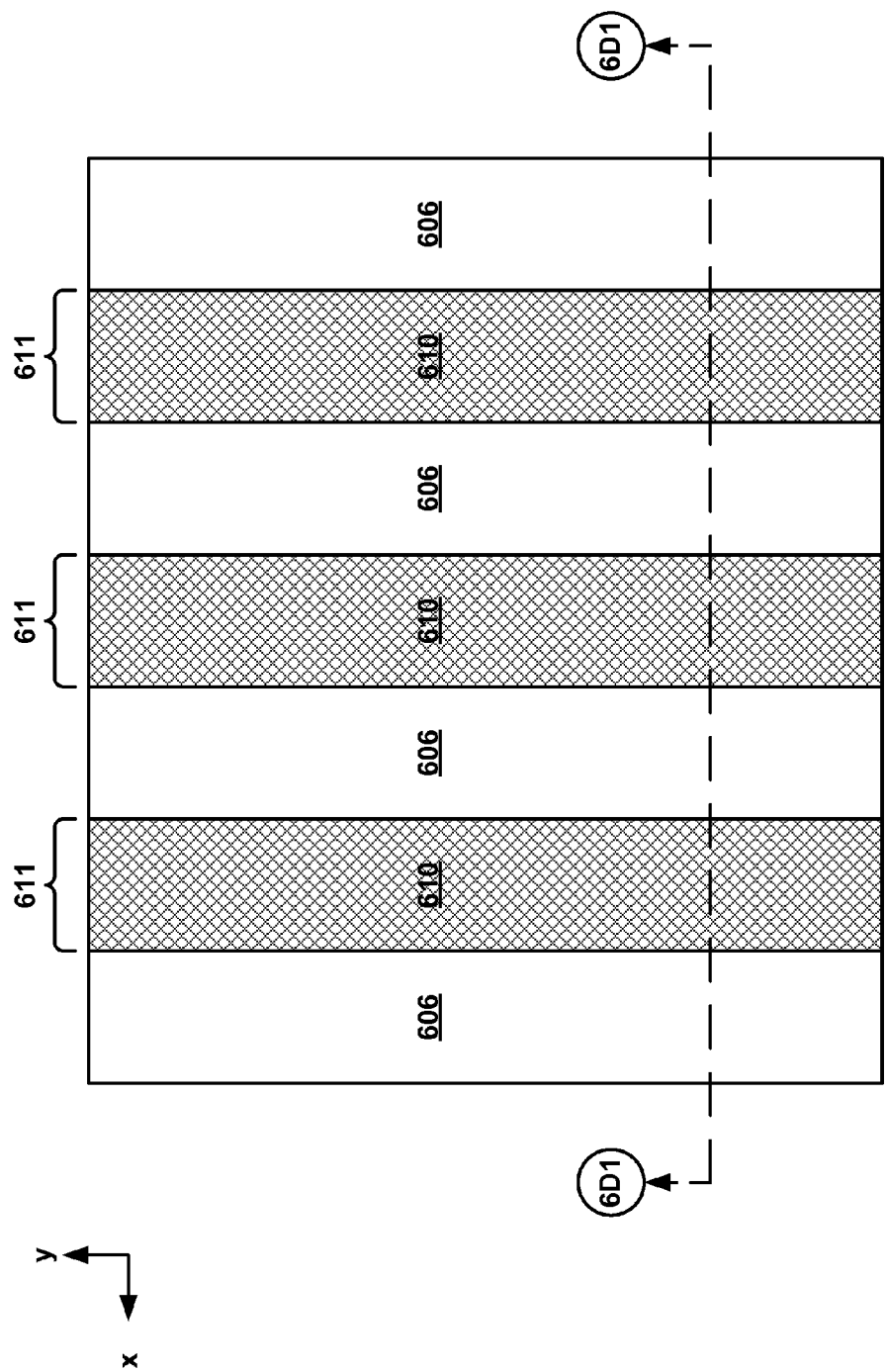
FIG. 6D4

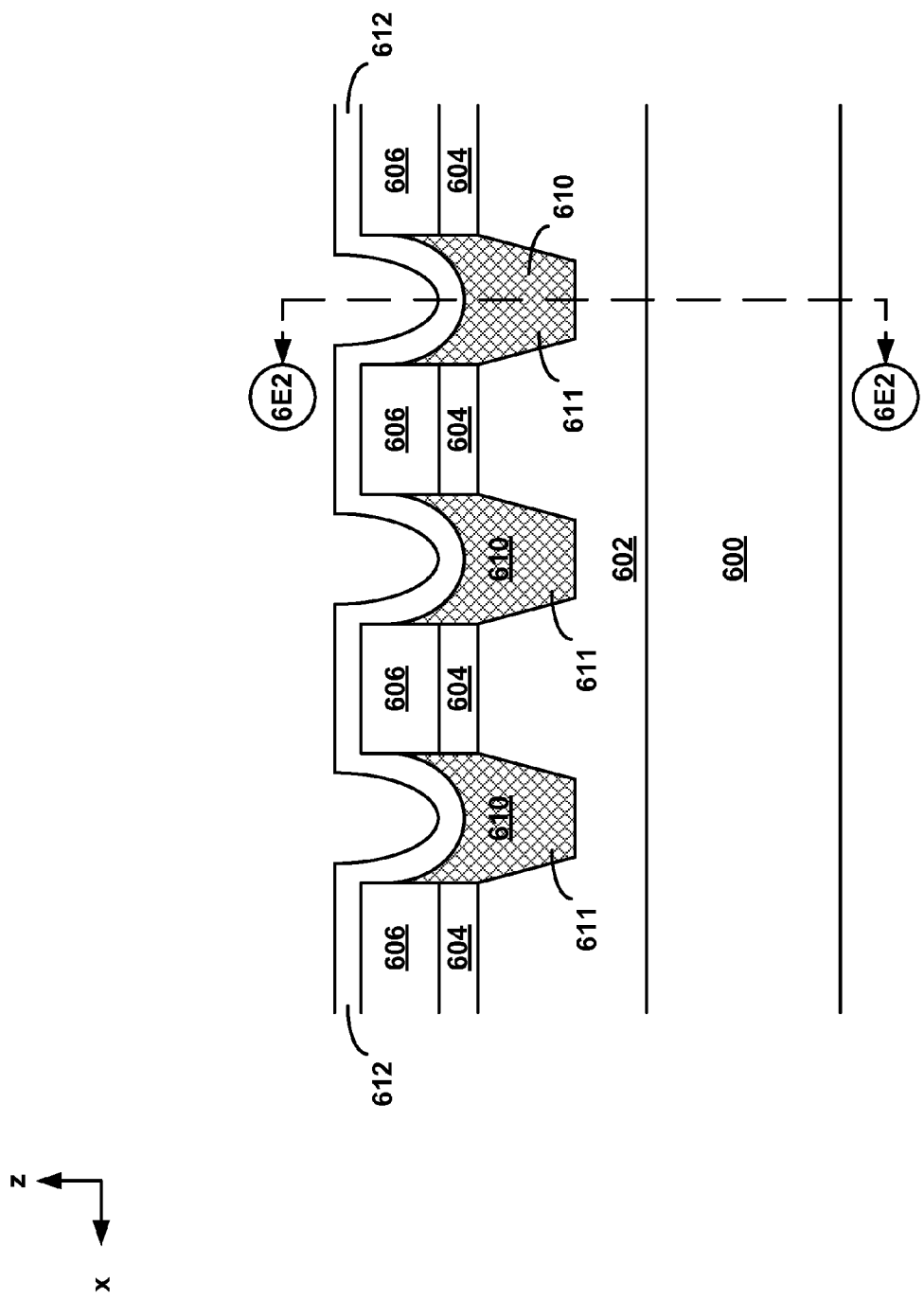
FIG. 6E1

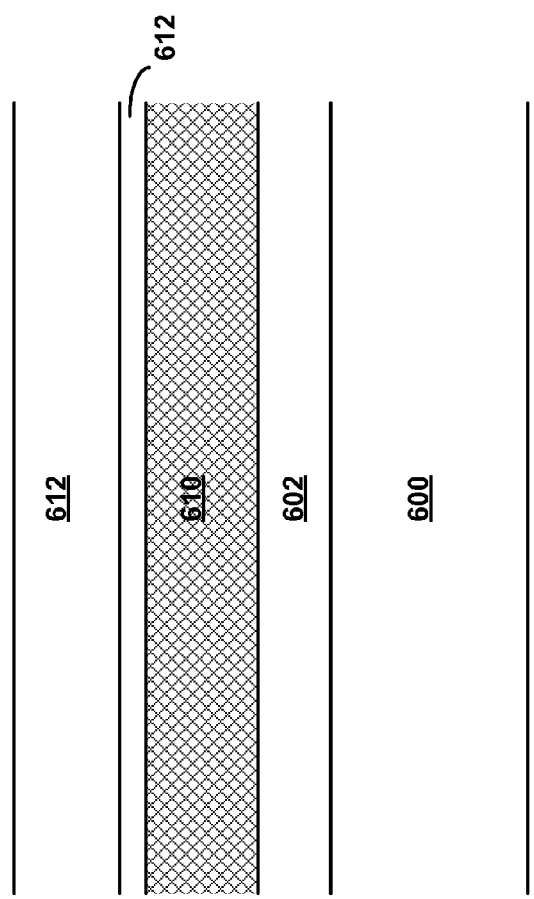
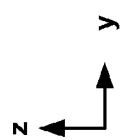
FIG. 6E2

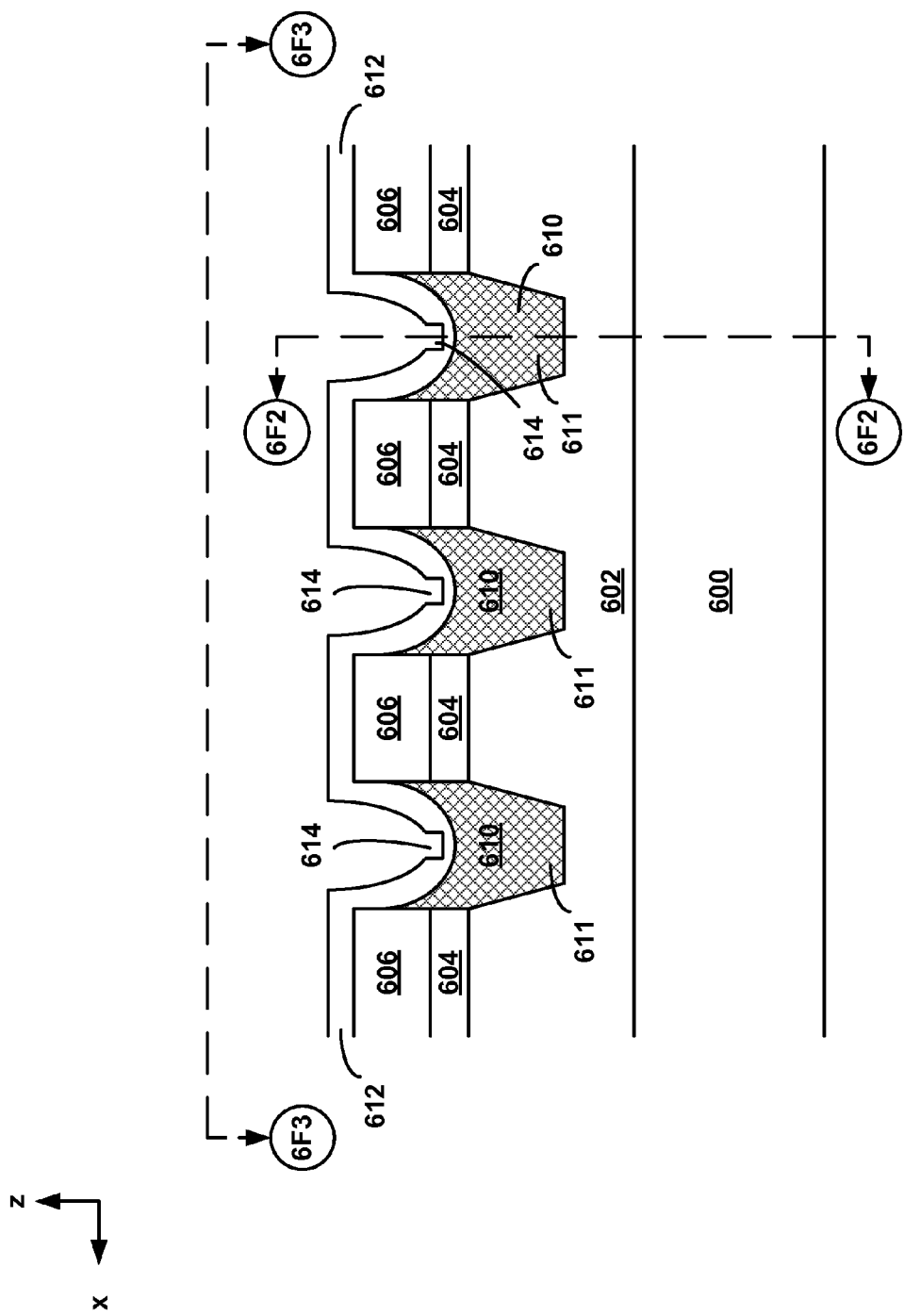
FIG. 6F1

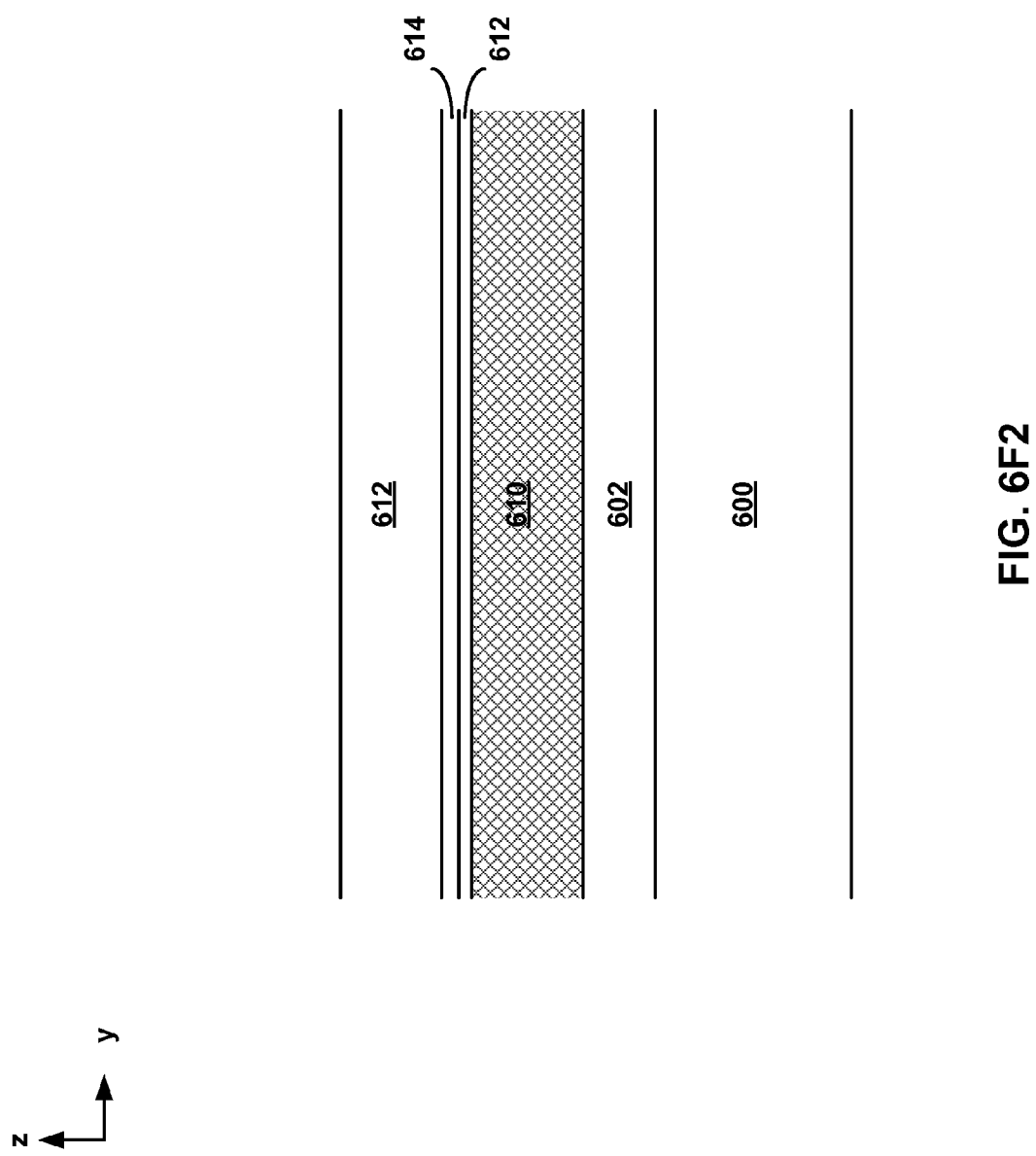

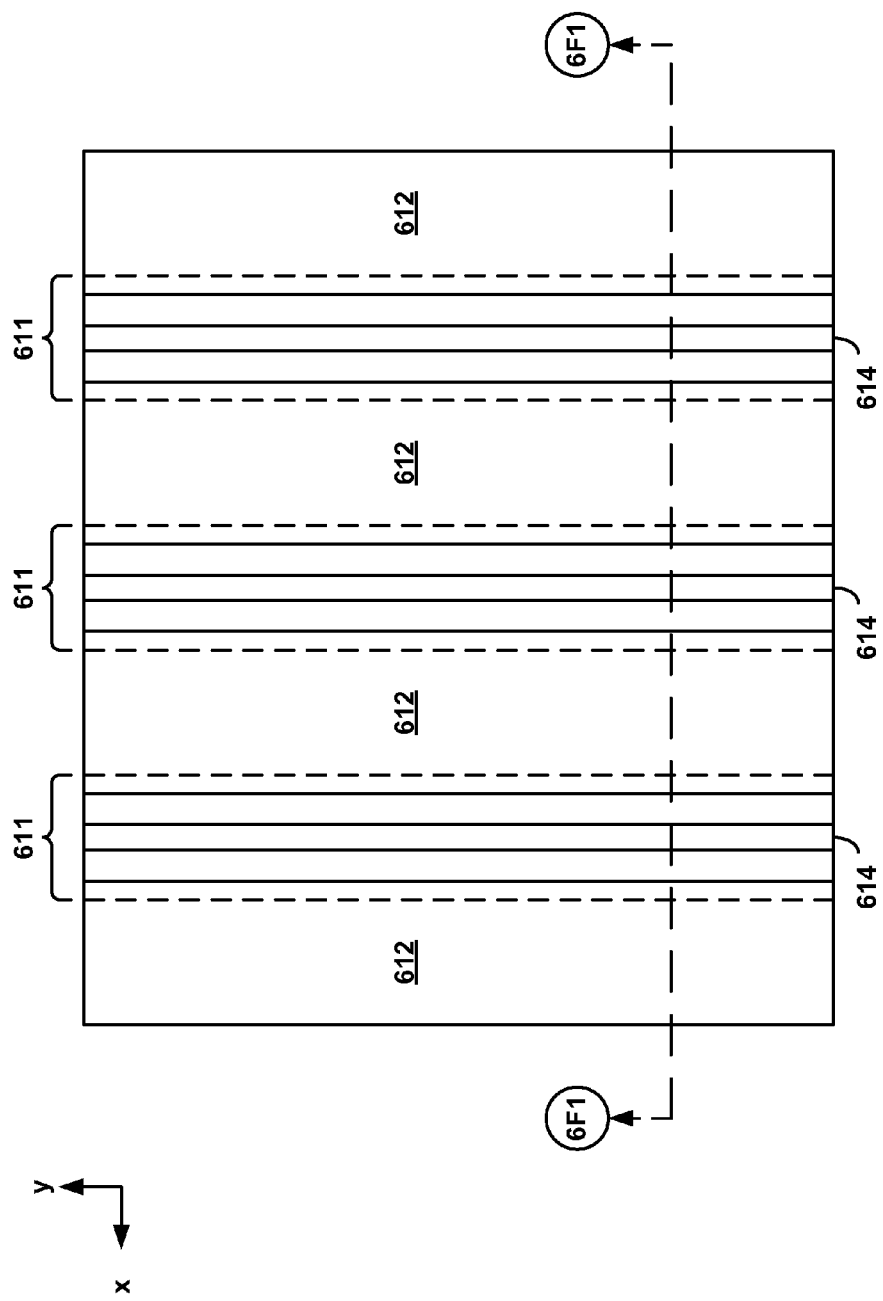
FIG. 6F3

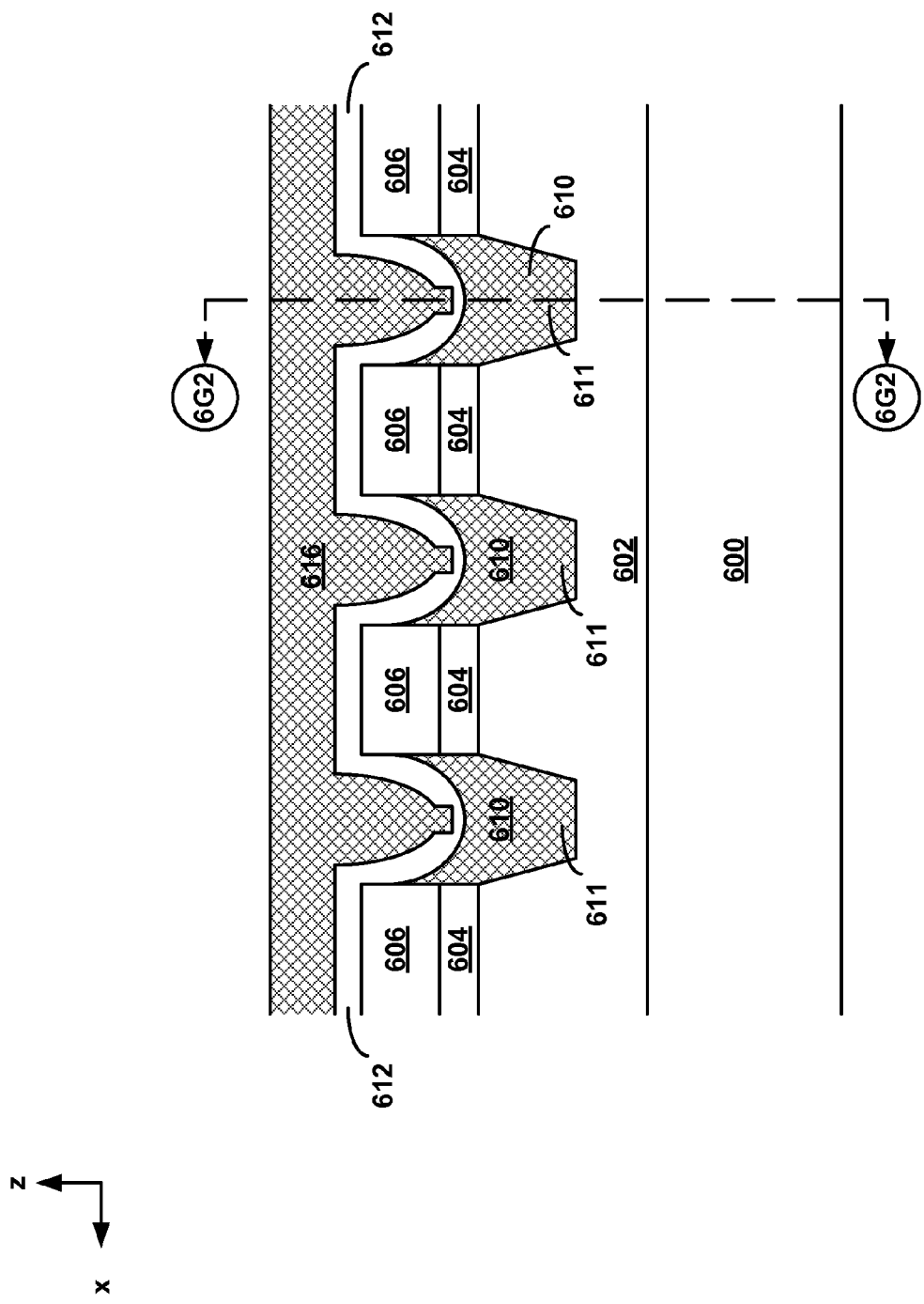
FIG. 6G1

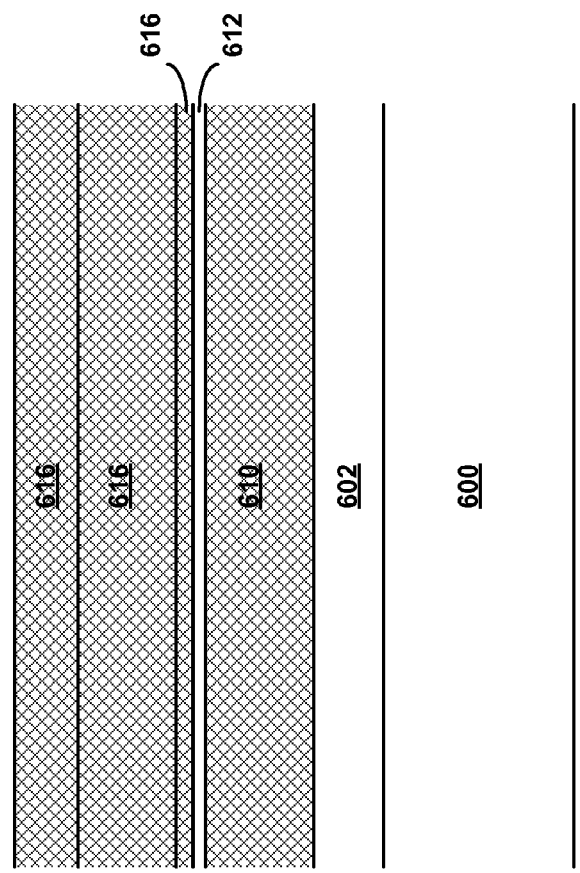
FIG. 6G2

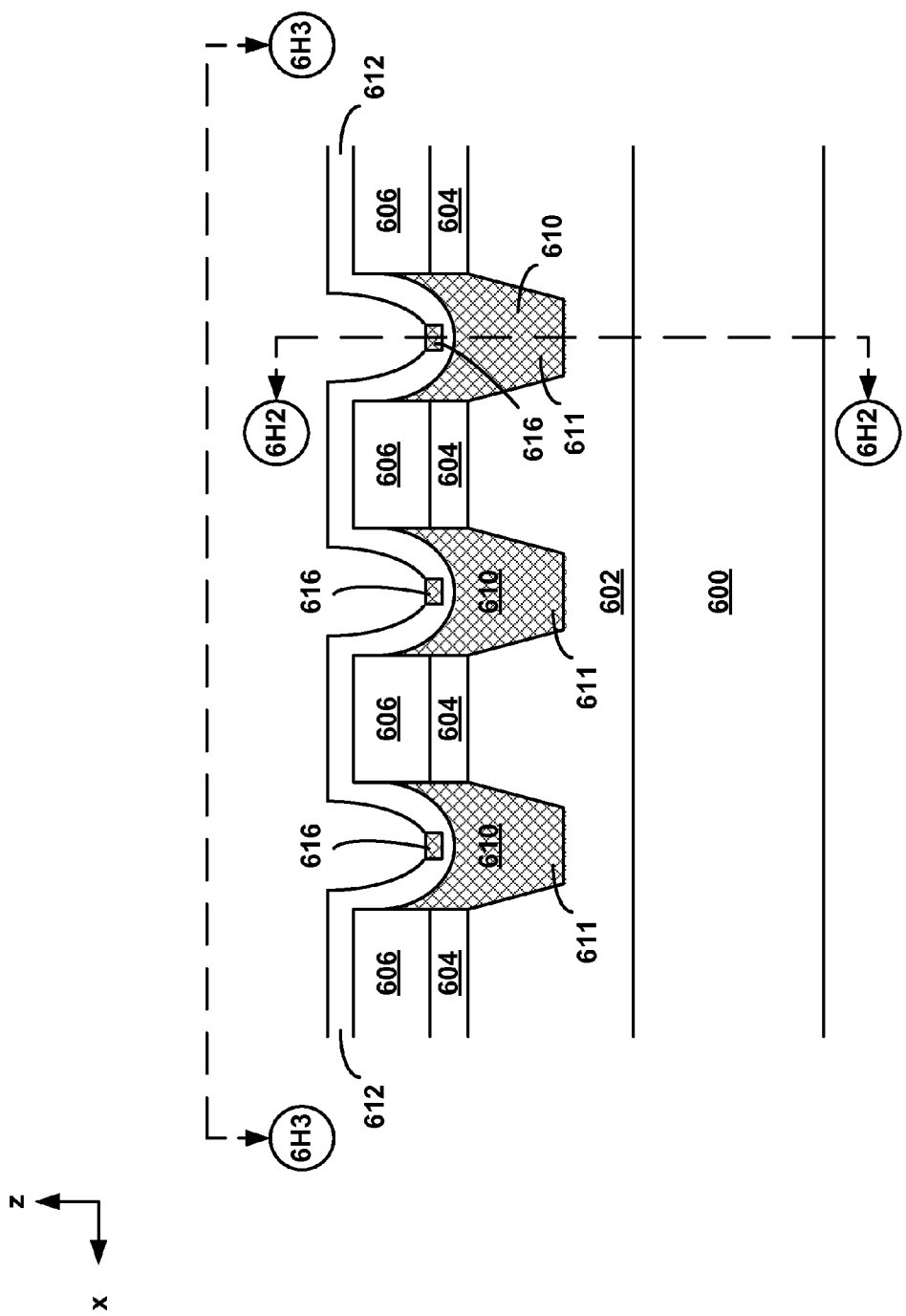
FIG. 6H1

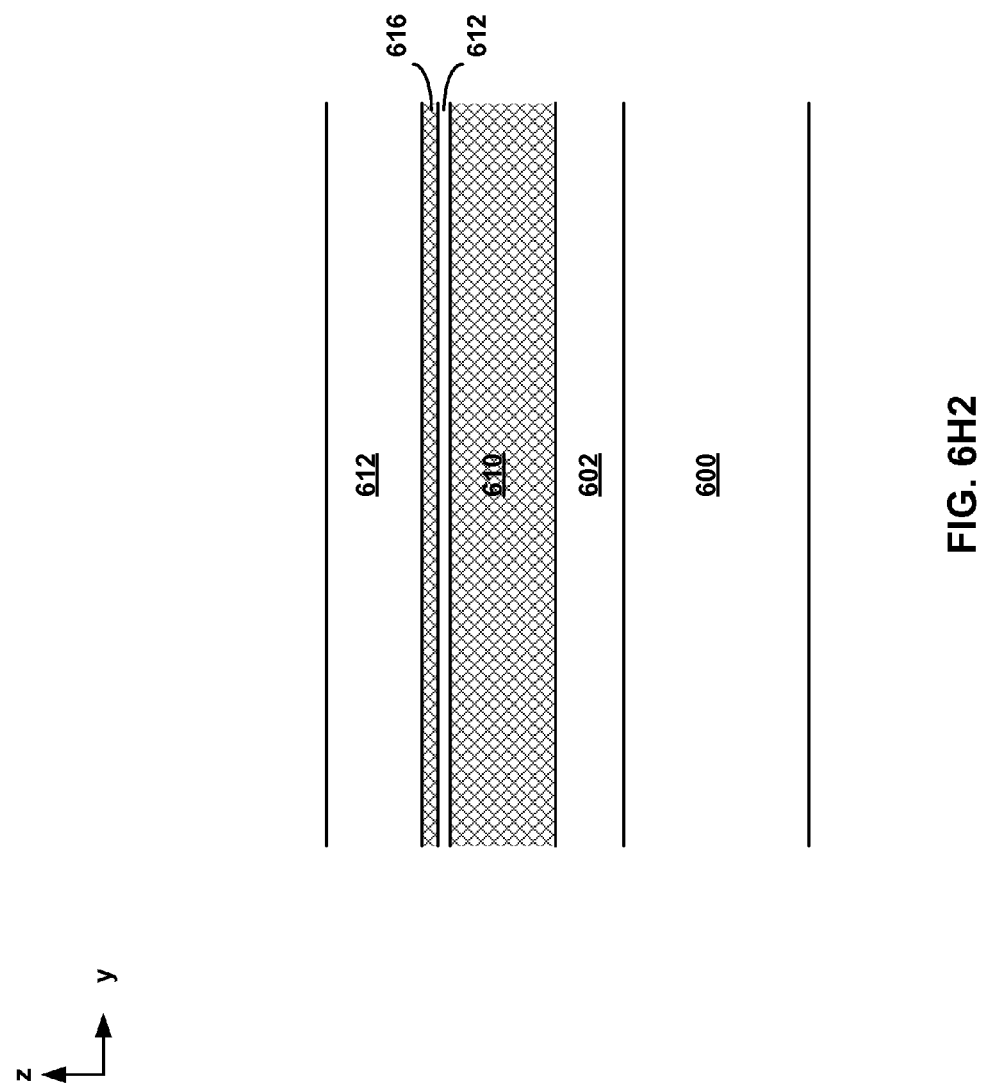
FIG. 6H2

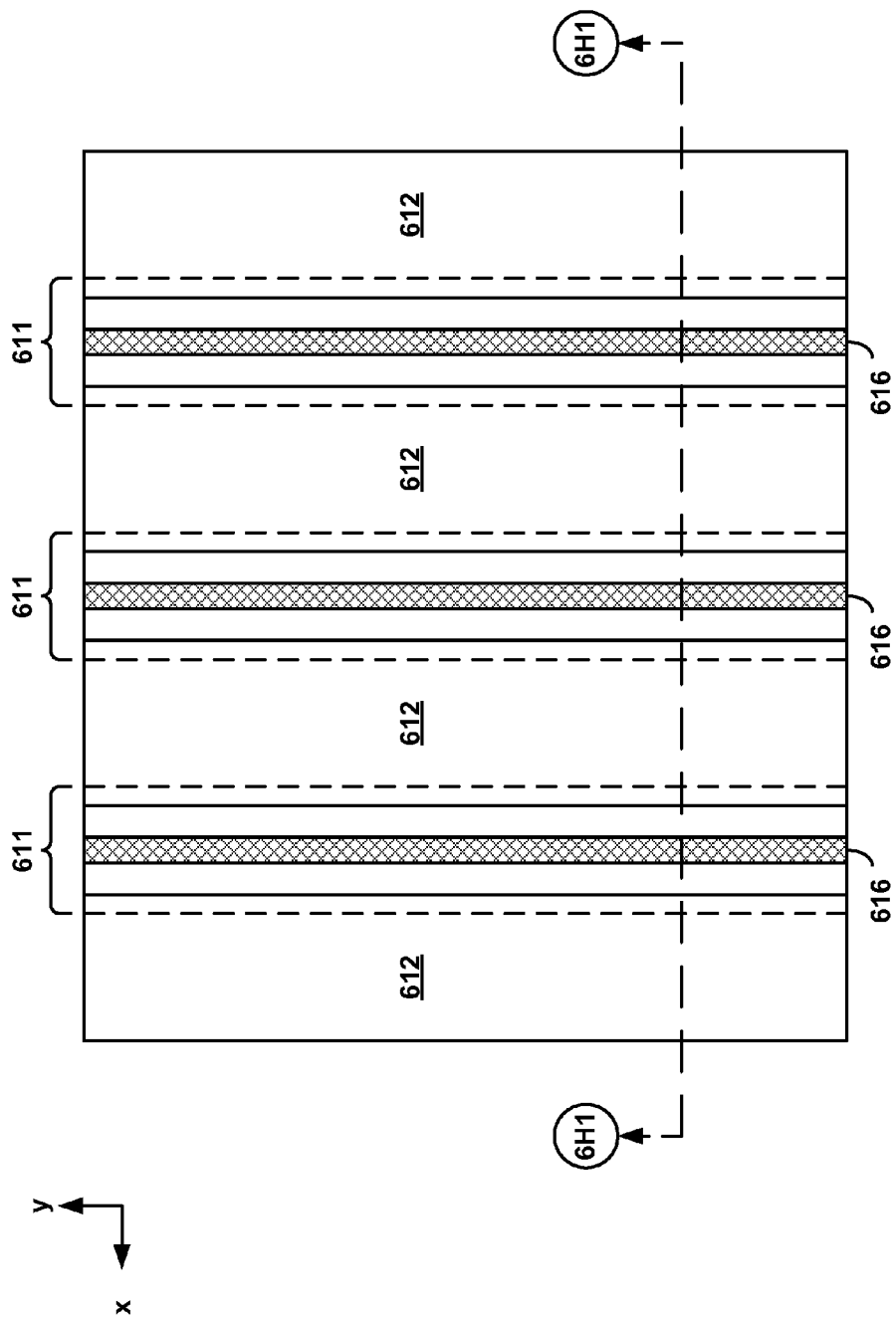
FIG. 6H3

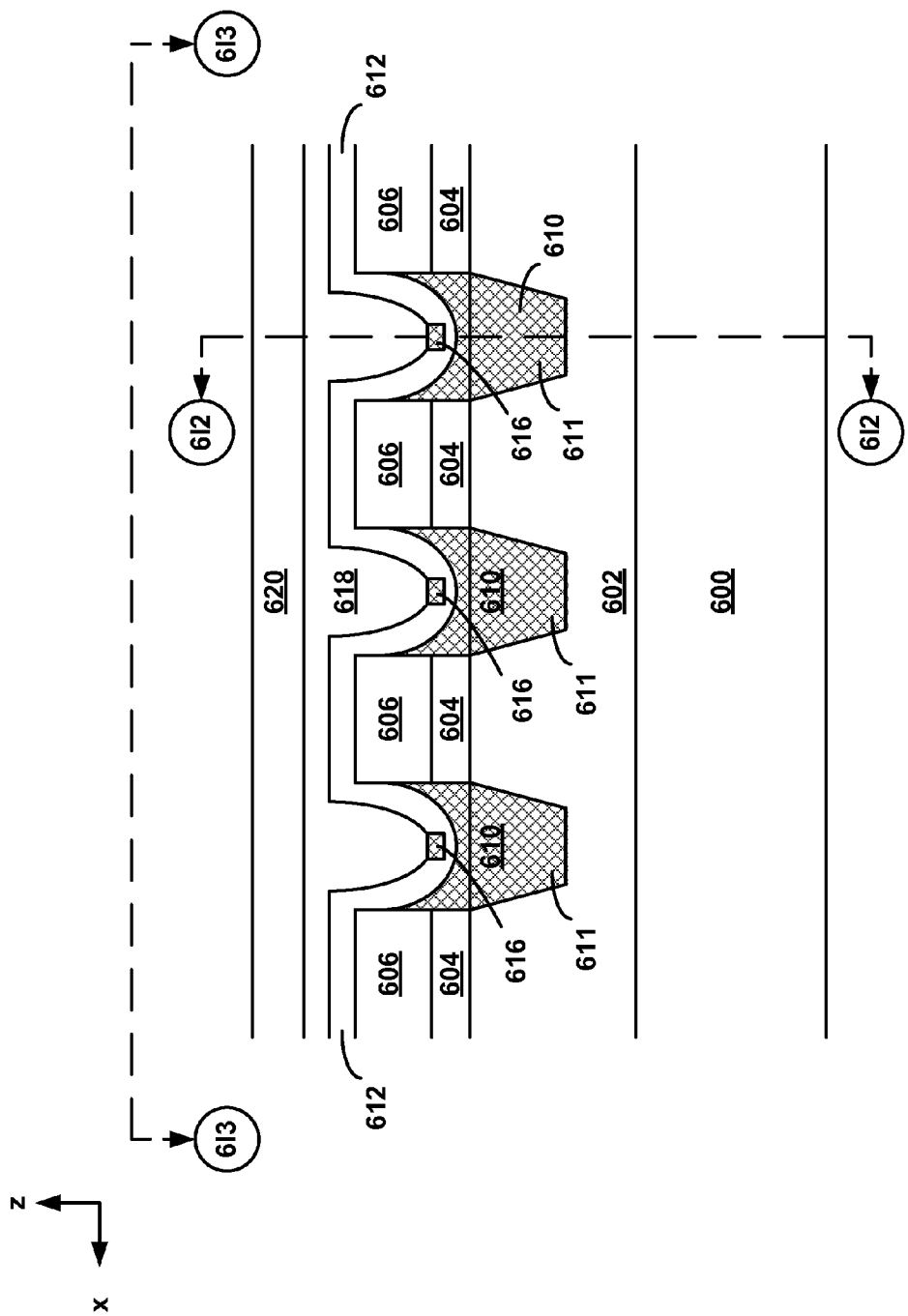
FIG. 6I1

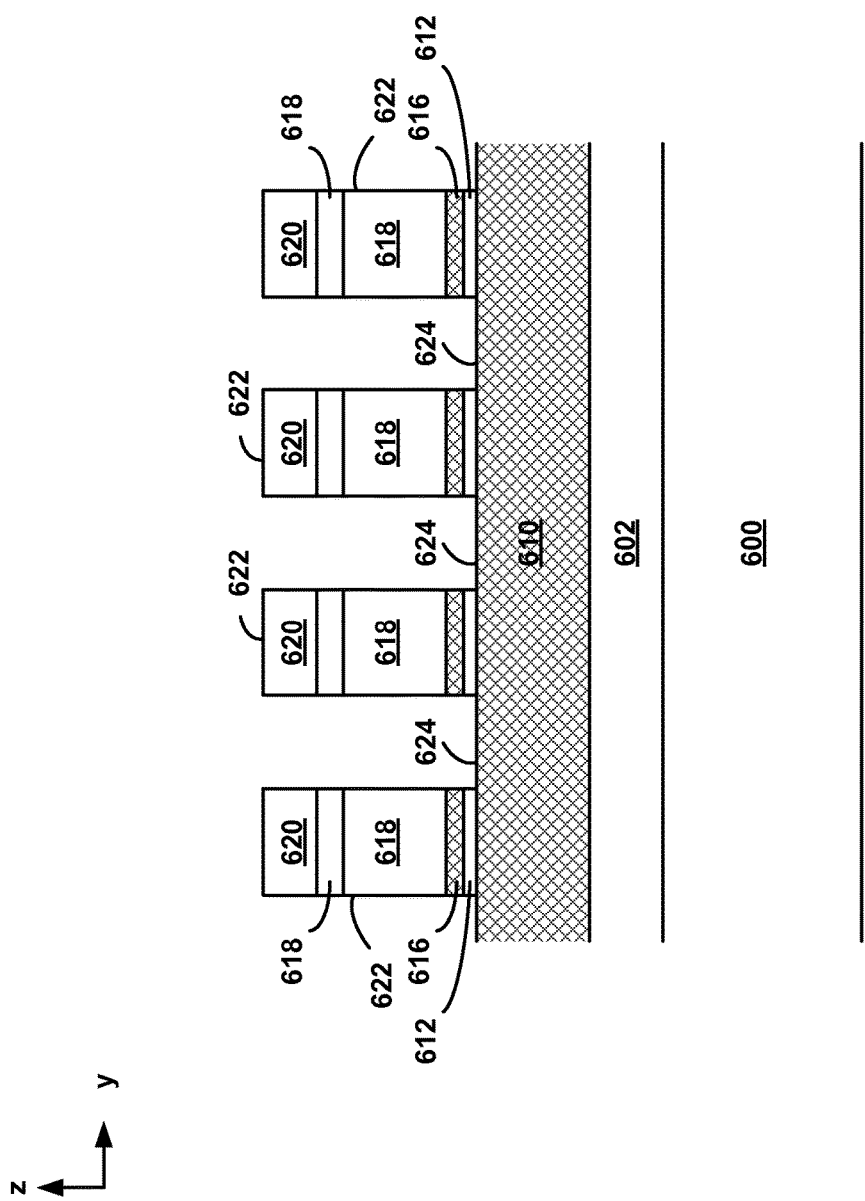
FIG. 6I2

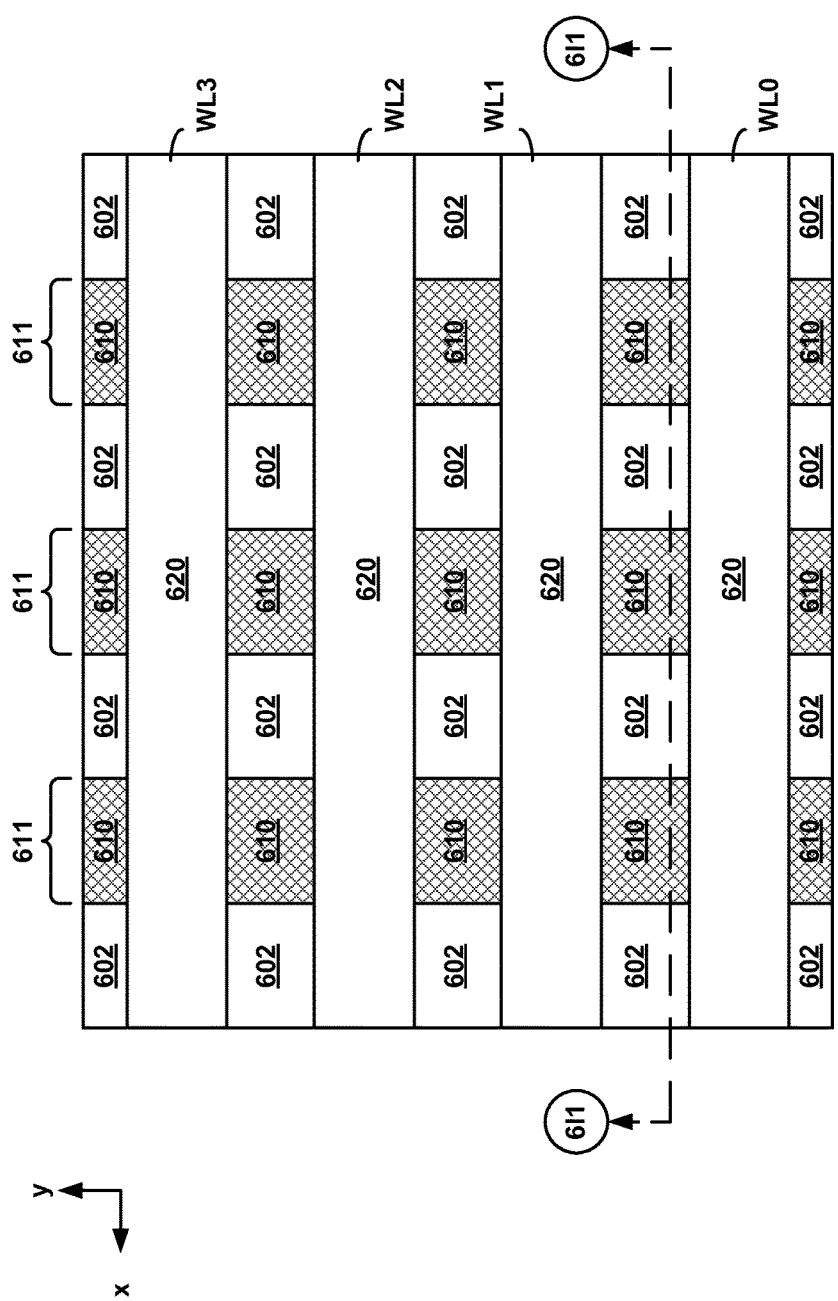
FIG. 6I3

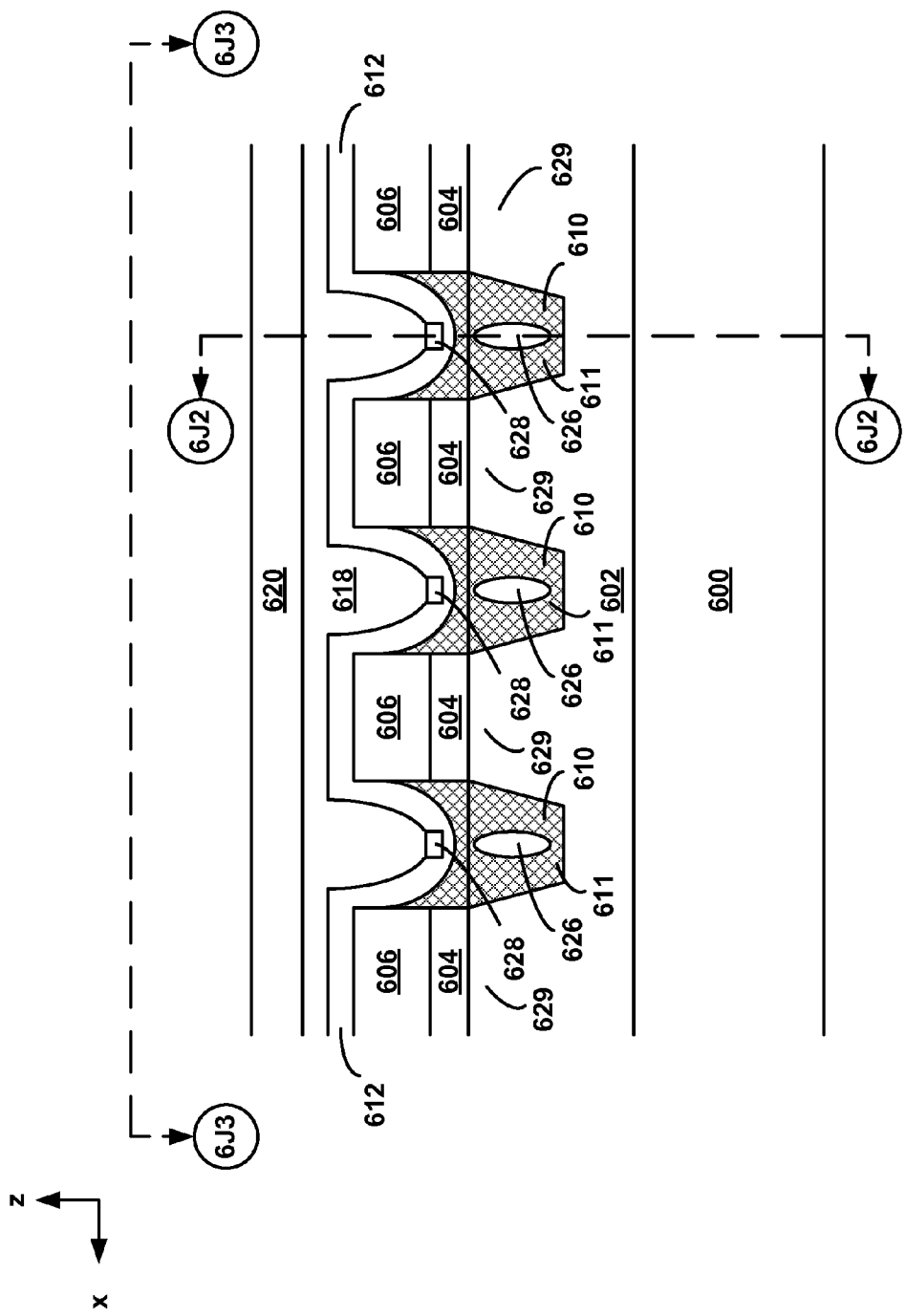
FIG. 6J1

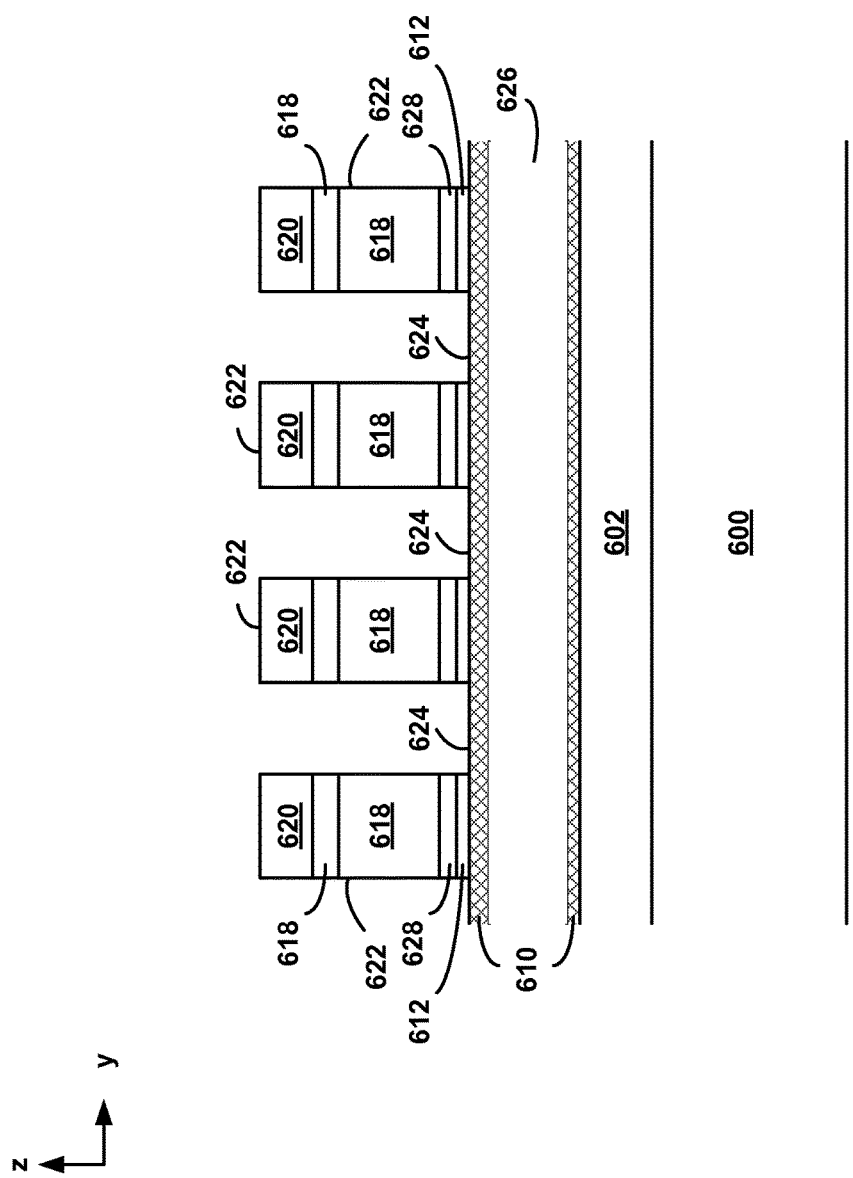
FIG. 6J2

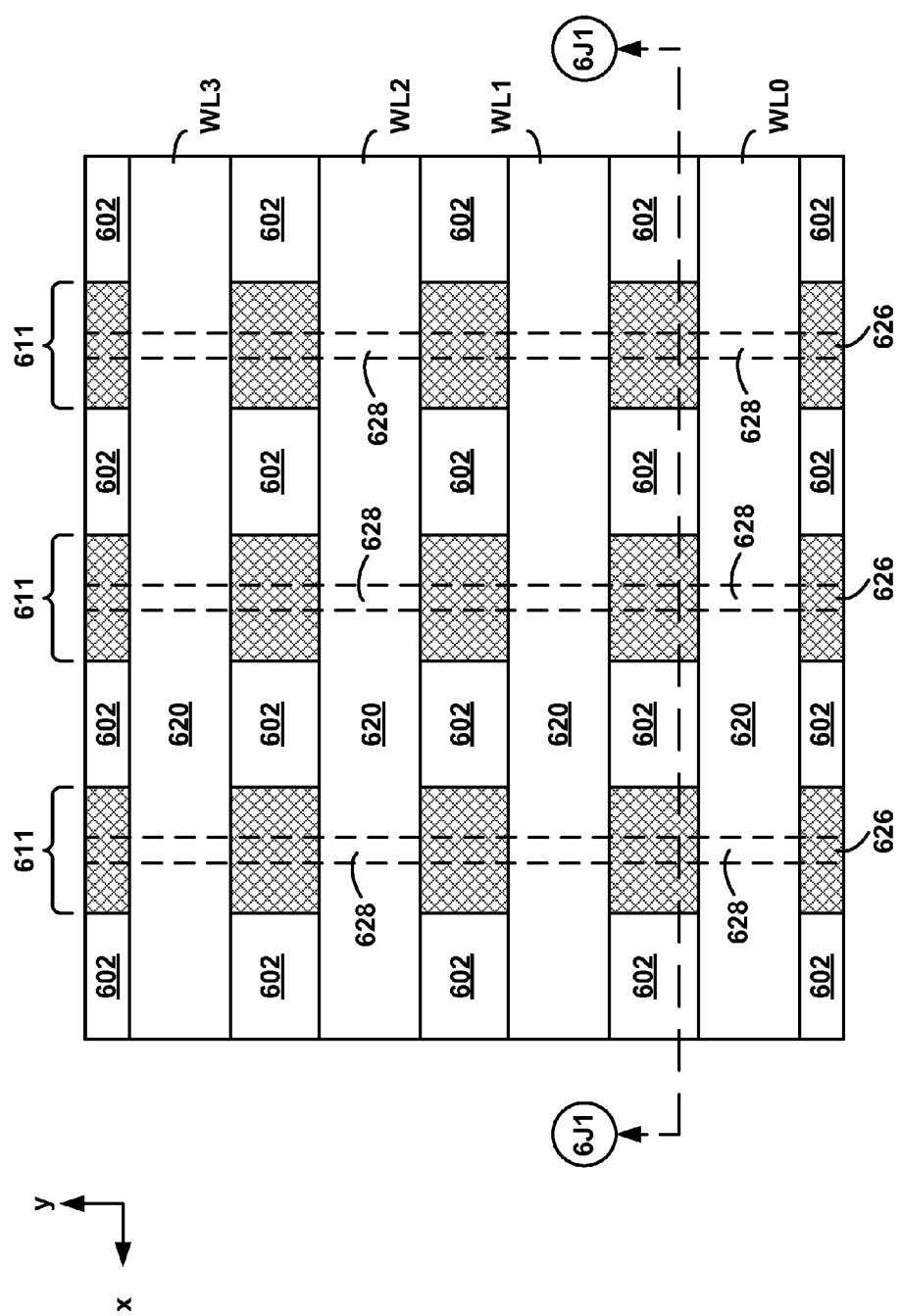
FIG. 6J3

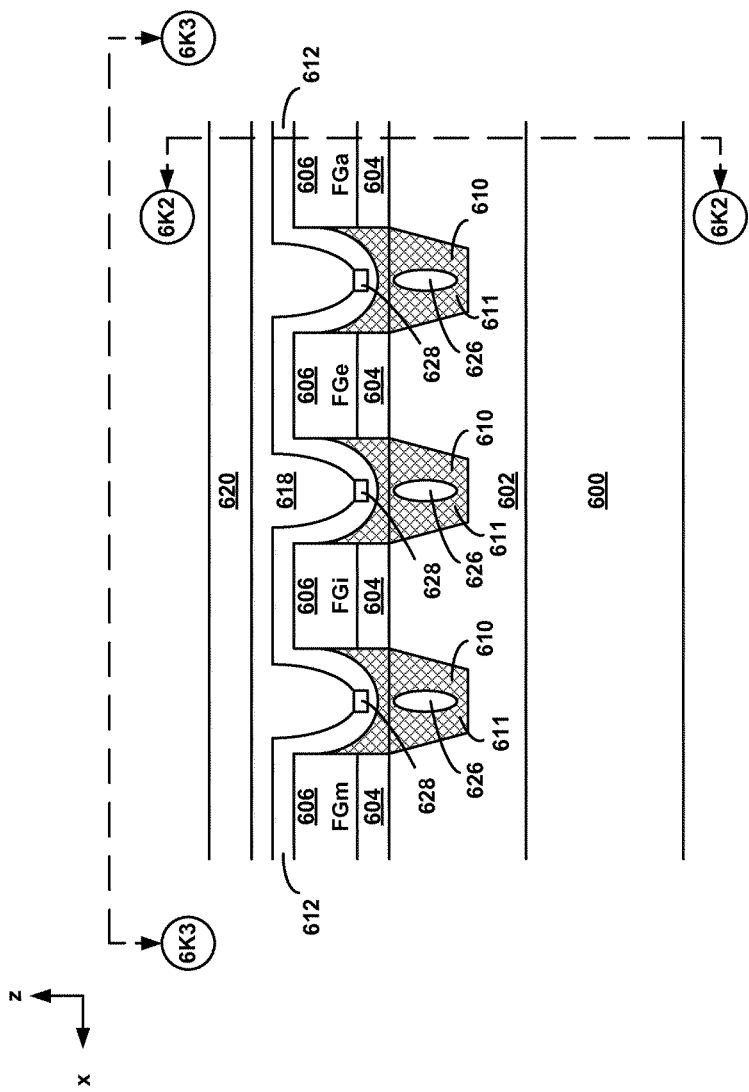
FIG. 6K1

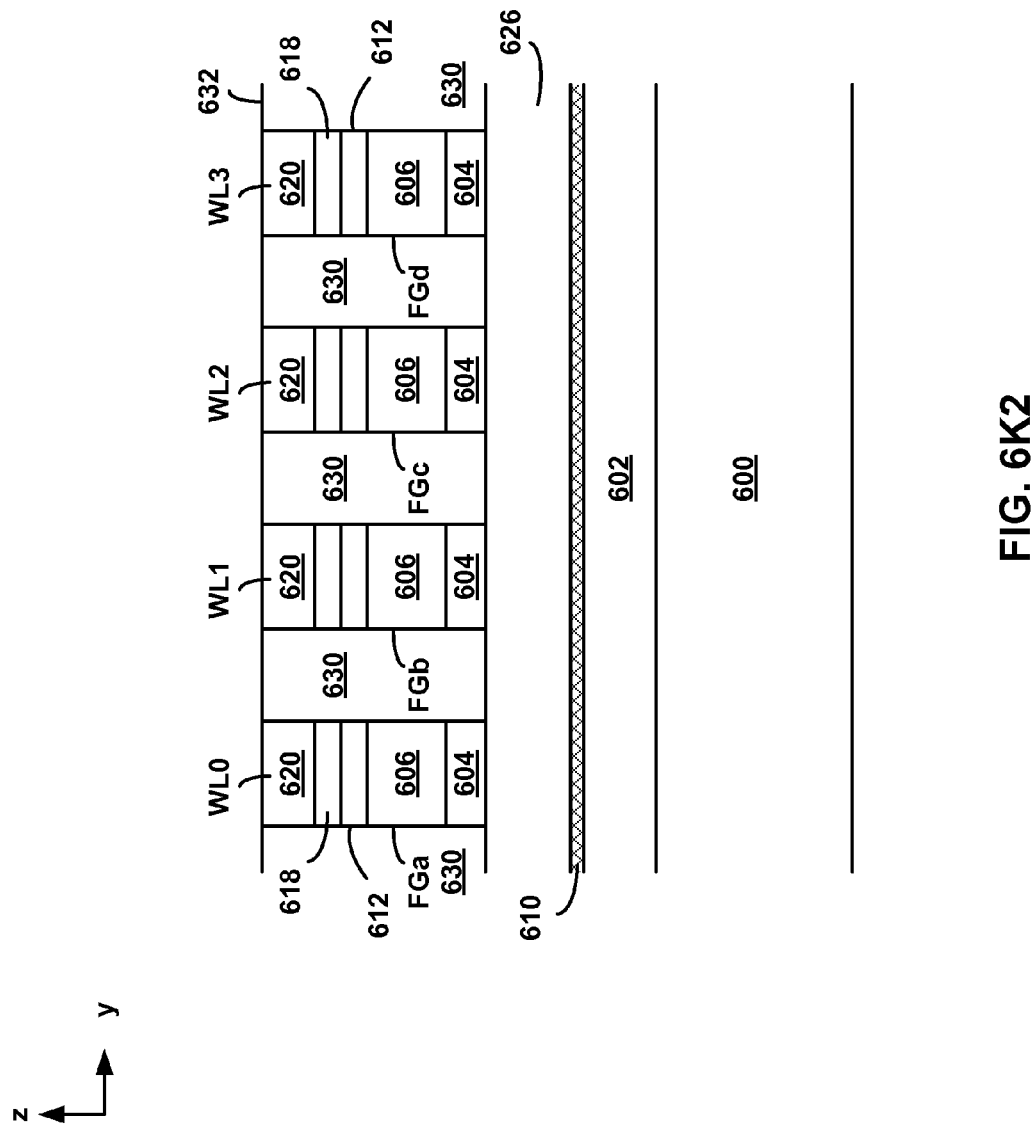
FIG. 6K2

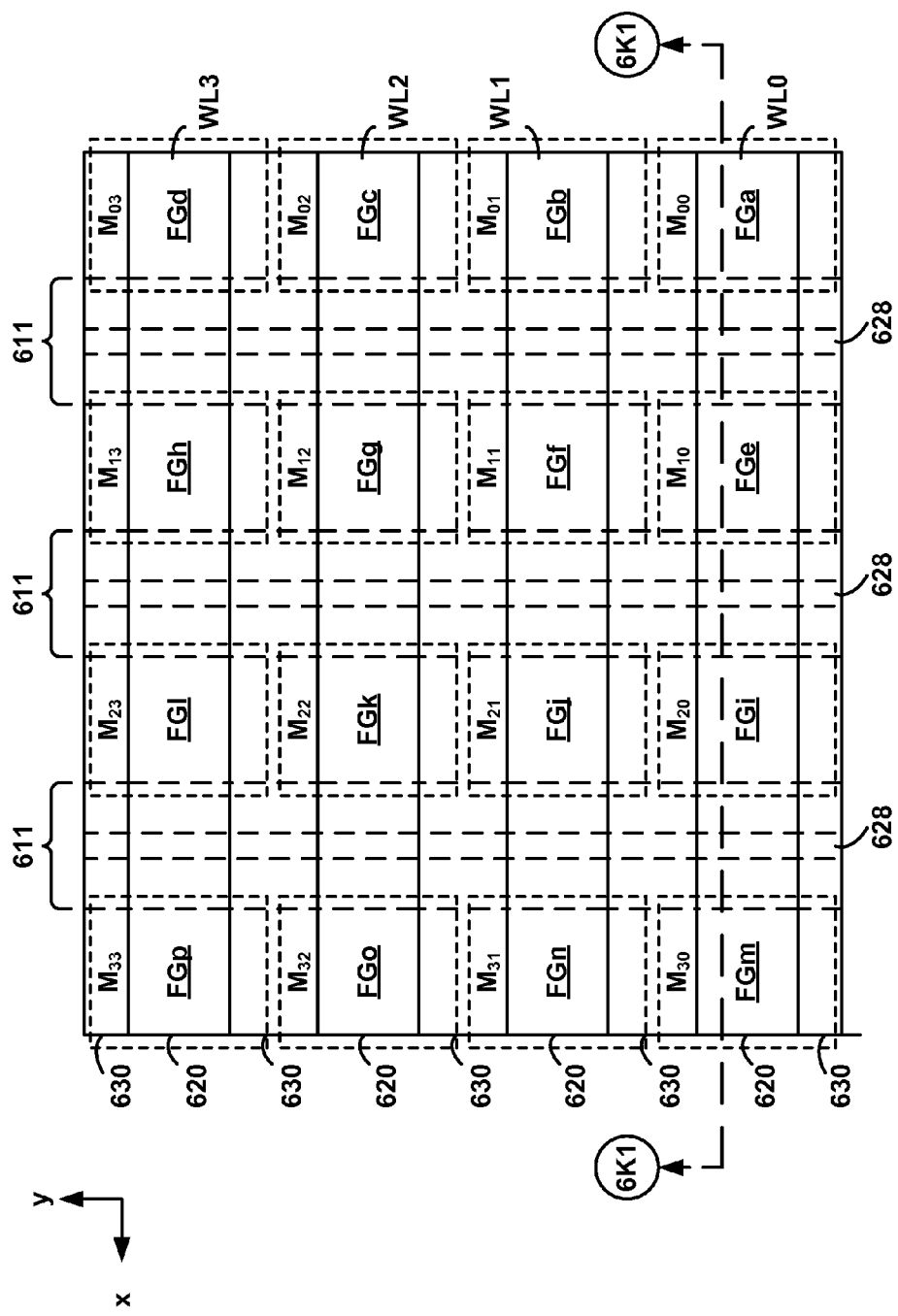
FIG. 6K3

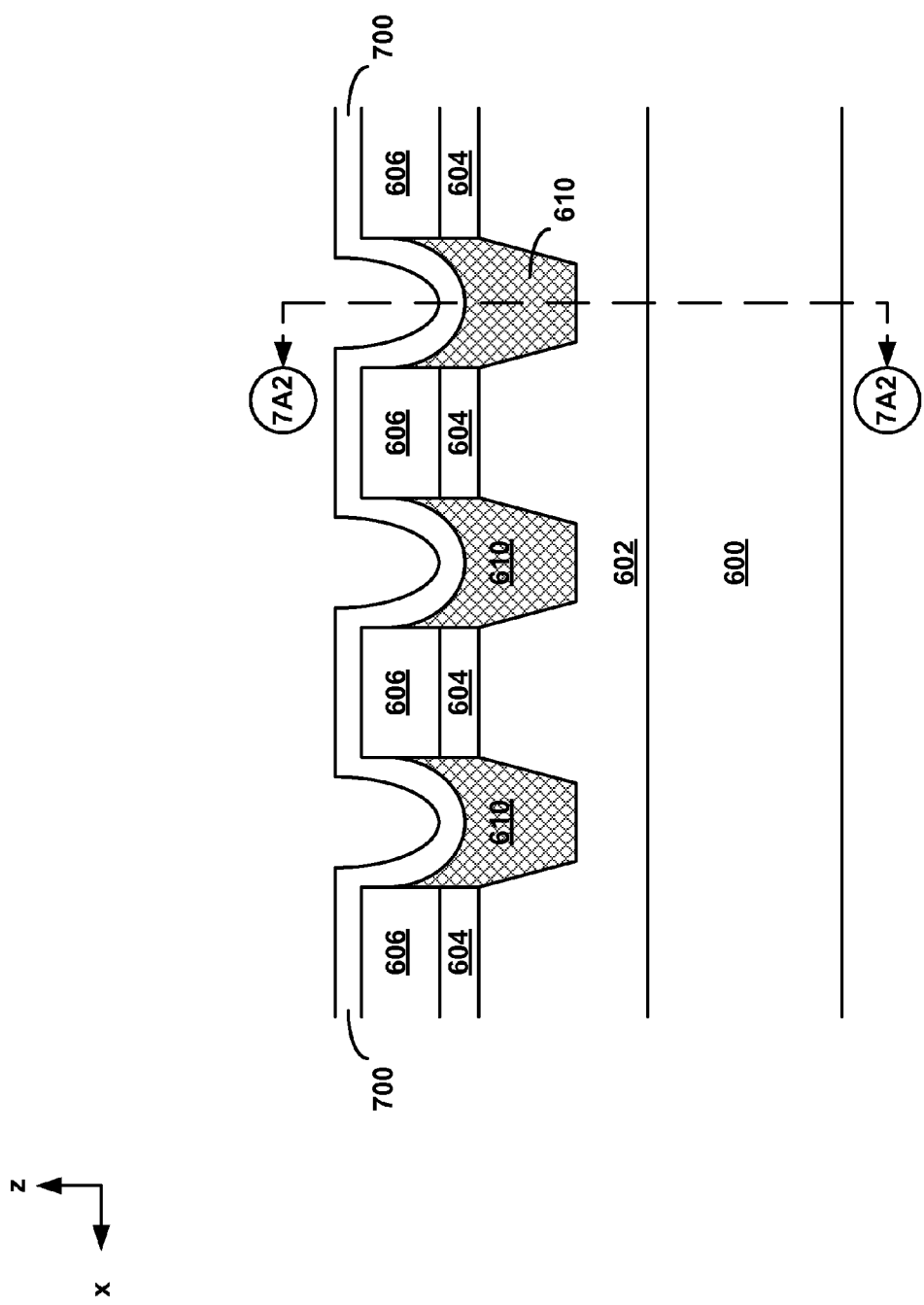
FIG. 7A1

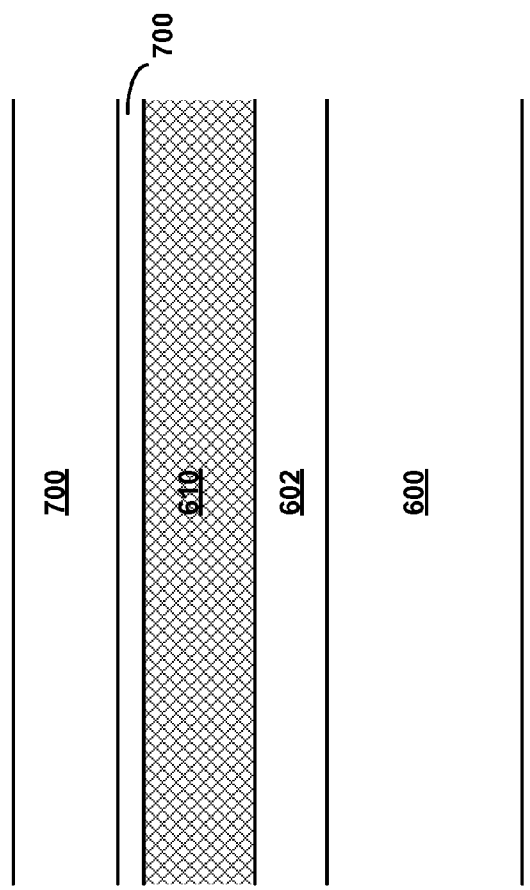
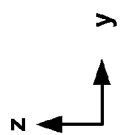
FIG. 7A2

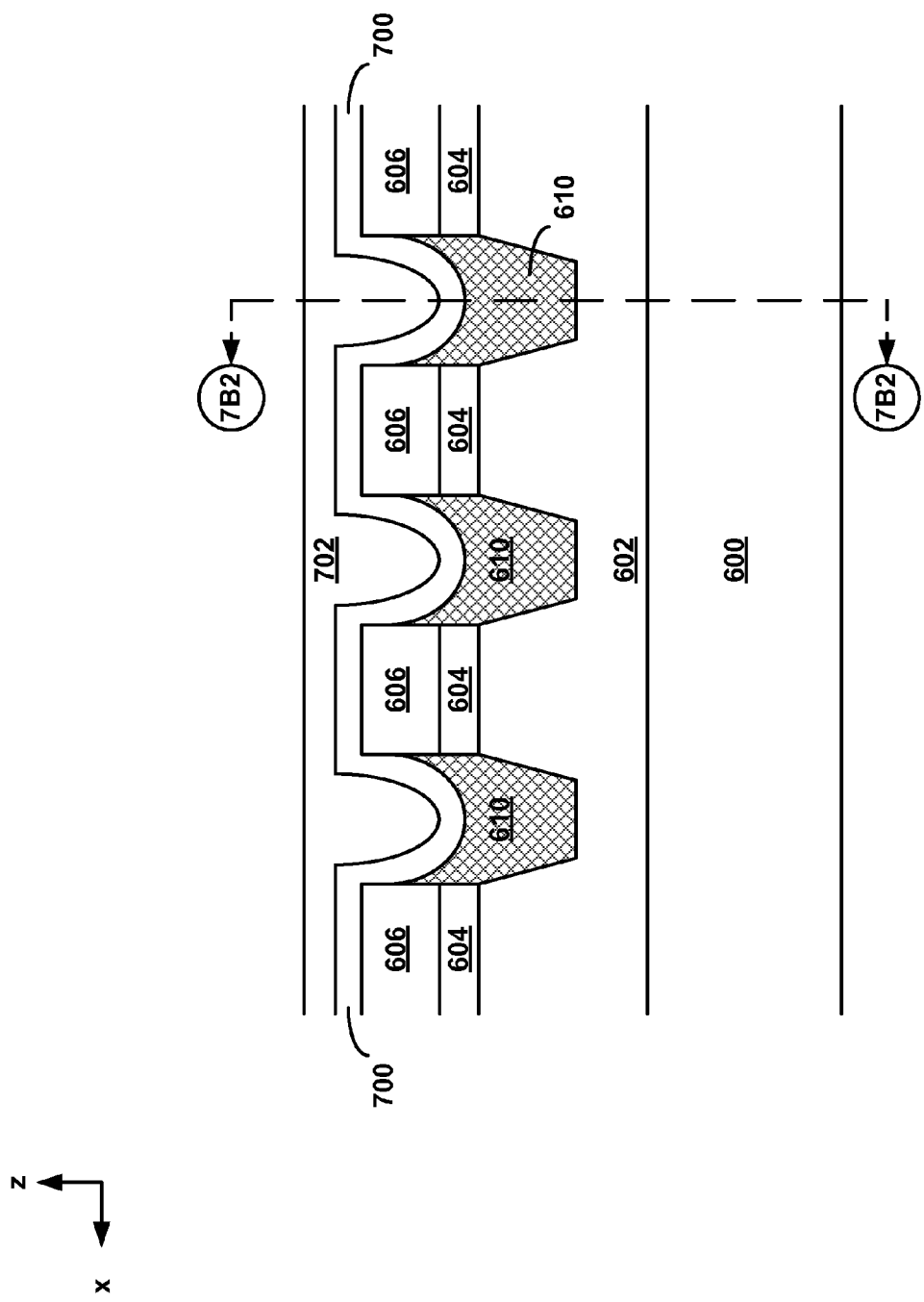

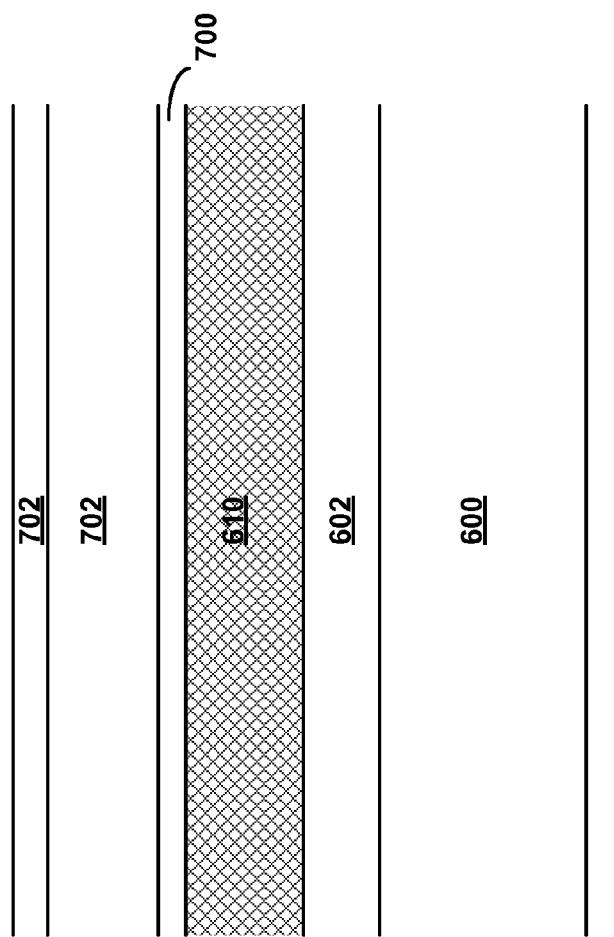
FIG. 7B2

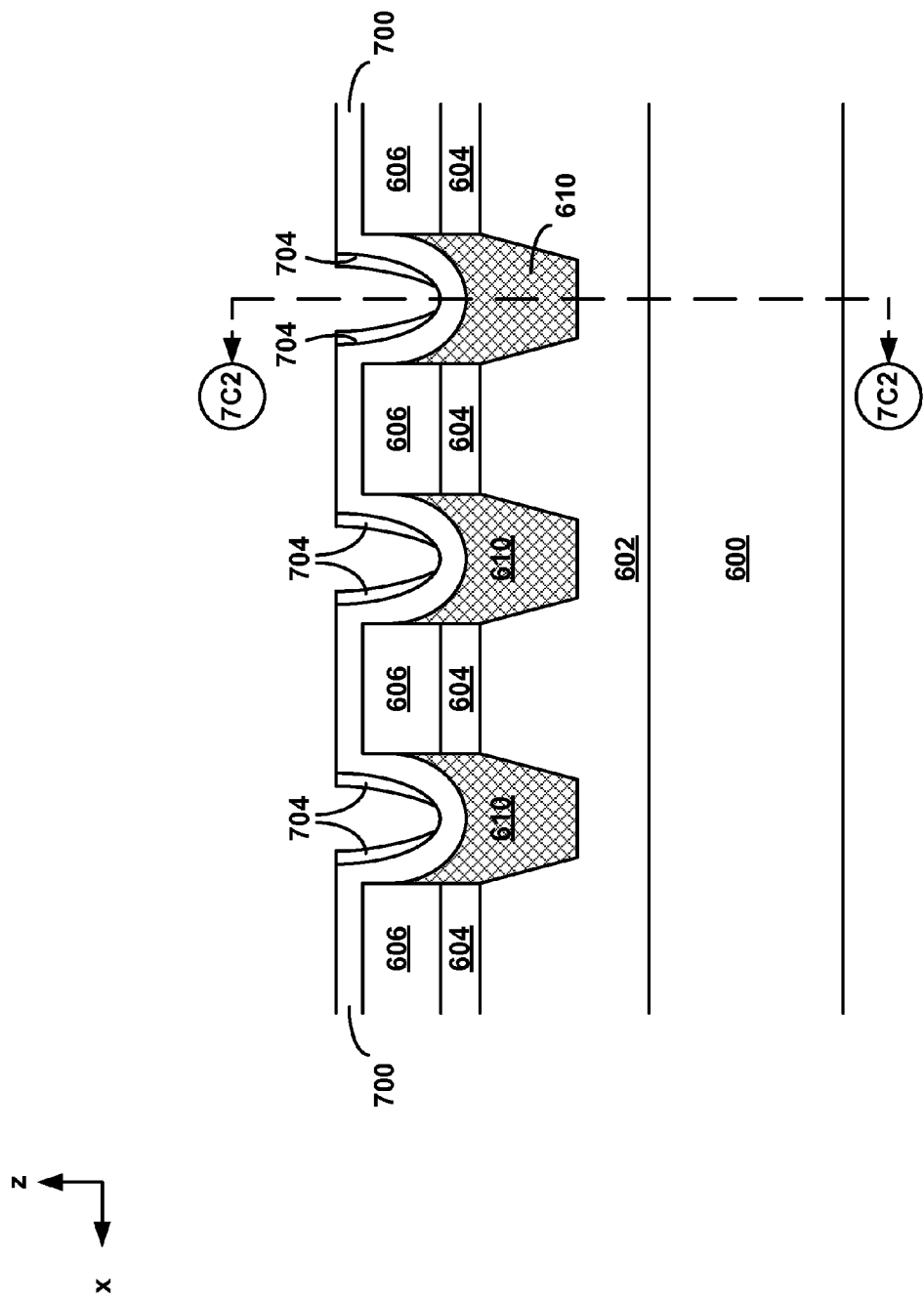
FIG. 7C1

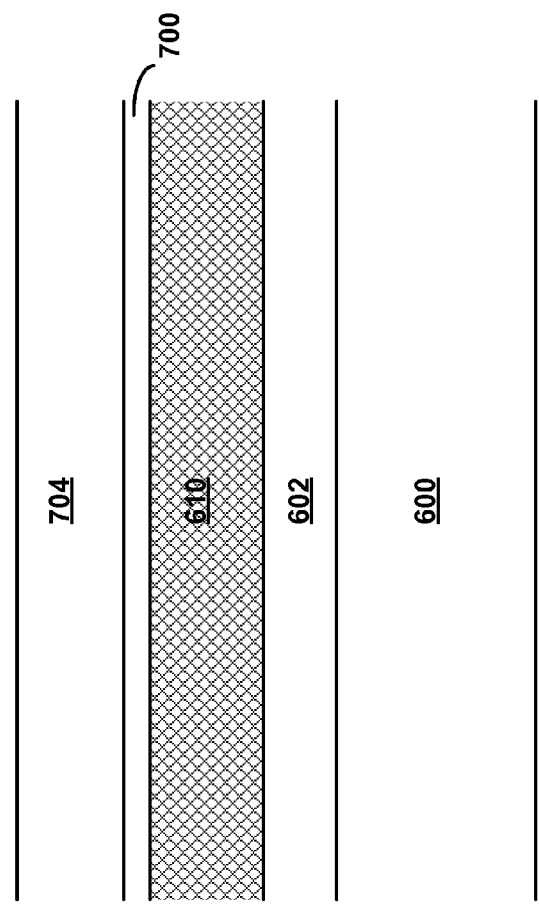
FIG. 7C2

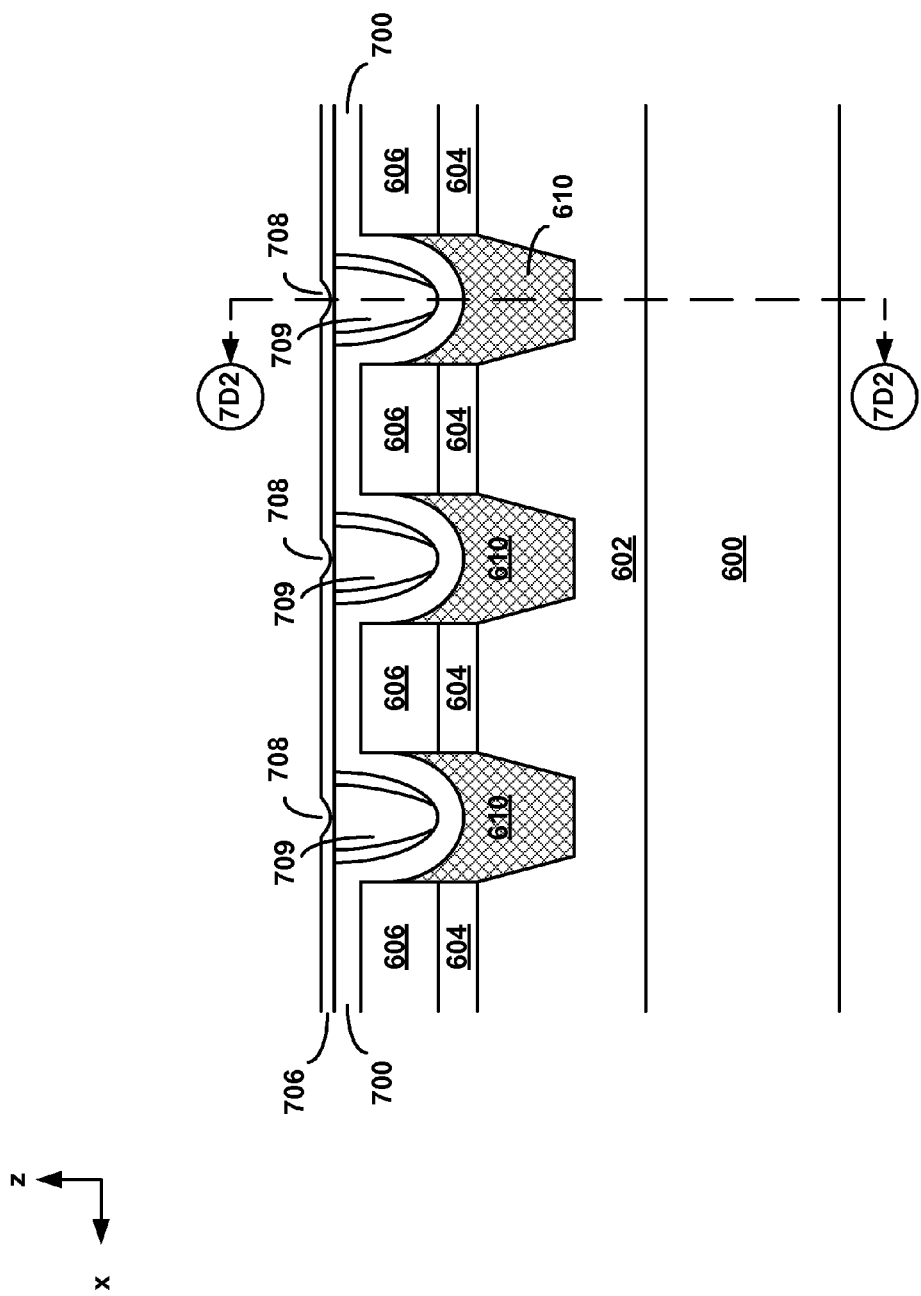

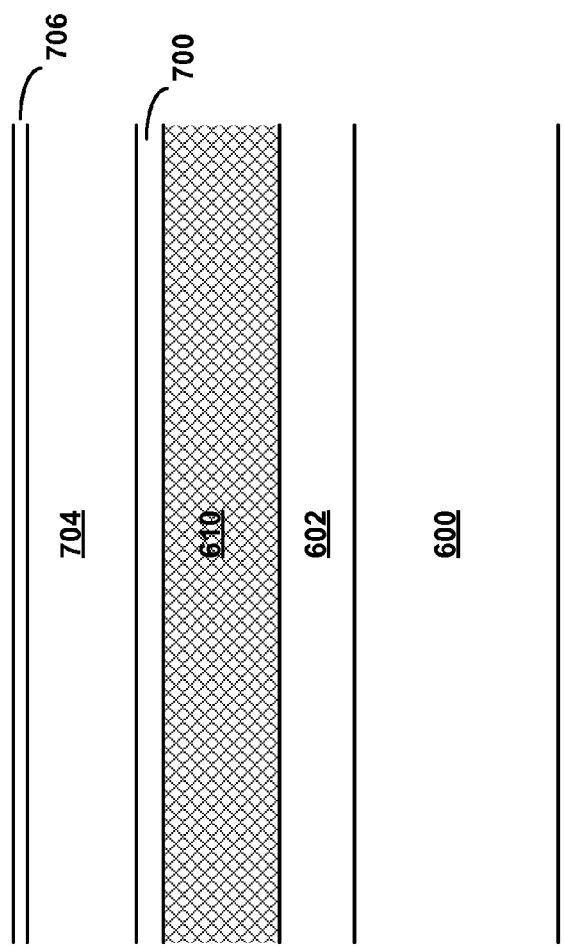
FIG. 7D2

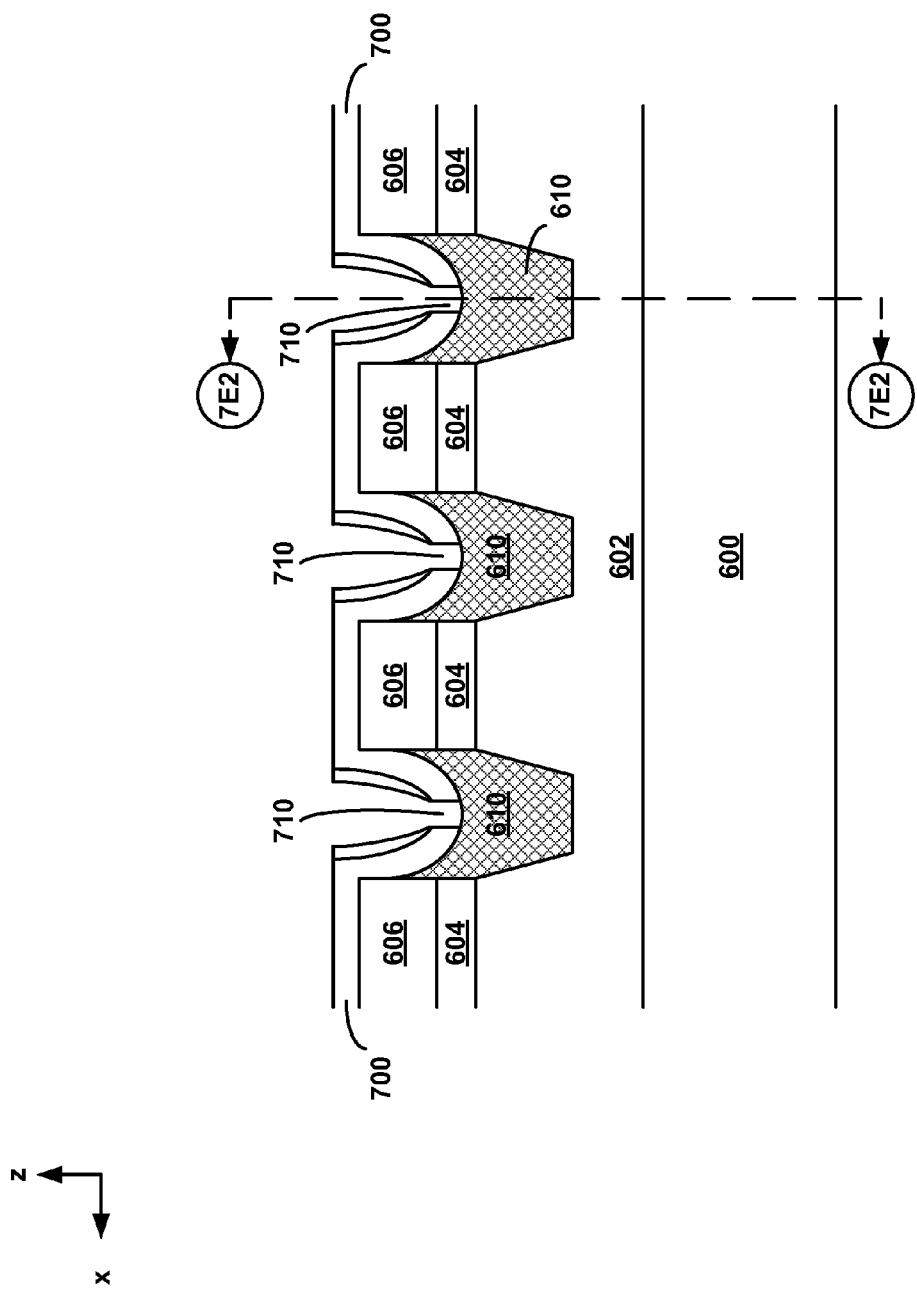
FIG. 7E1

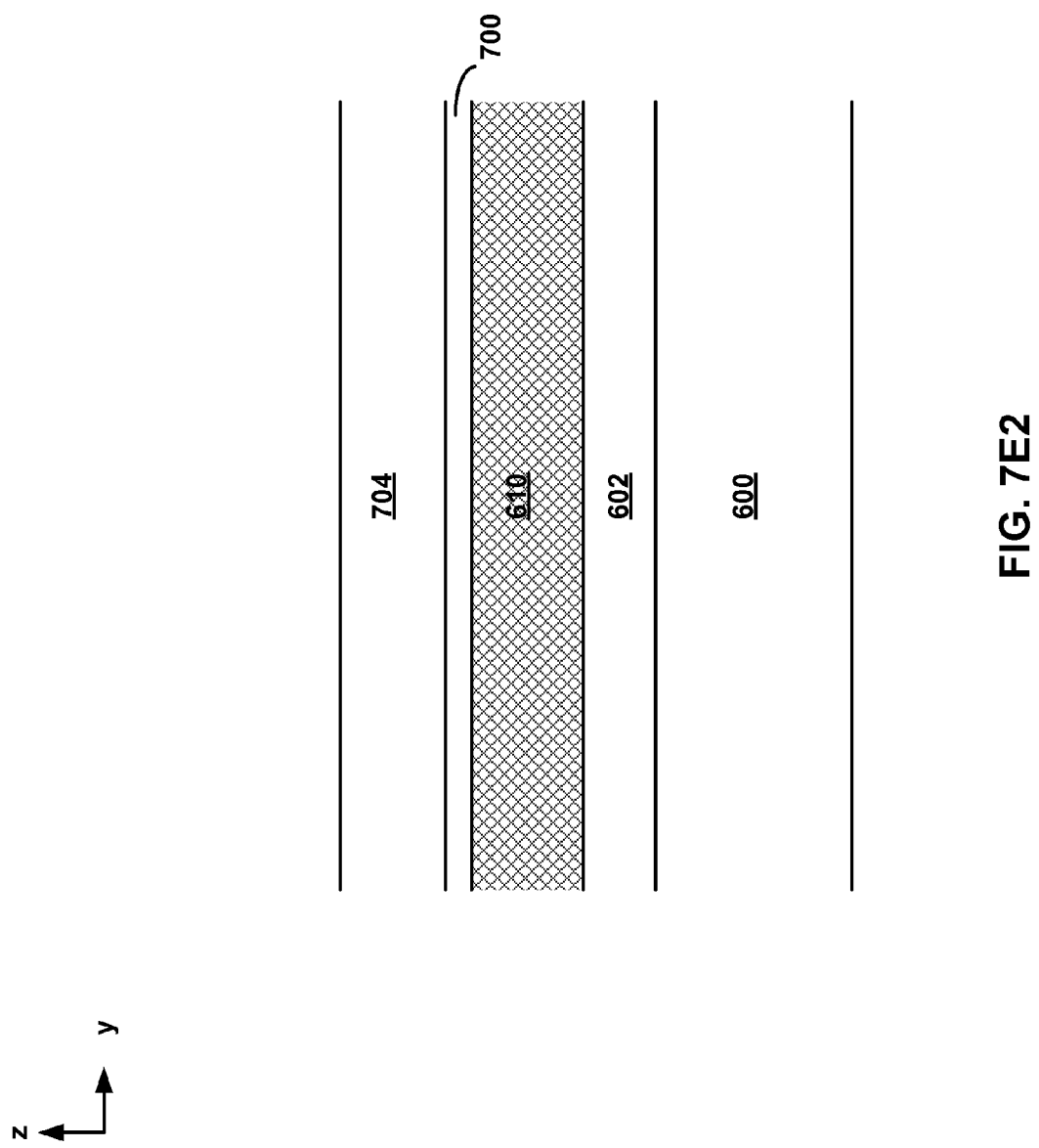

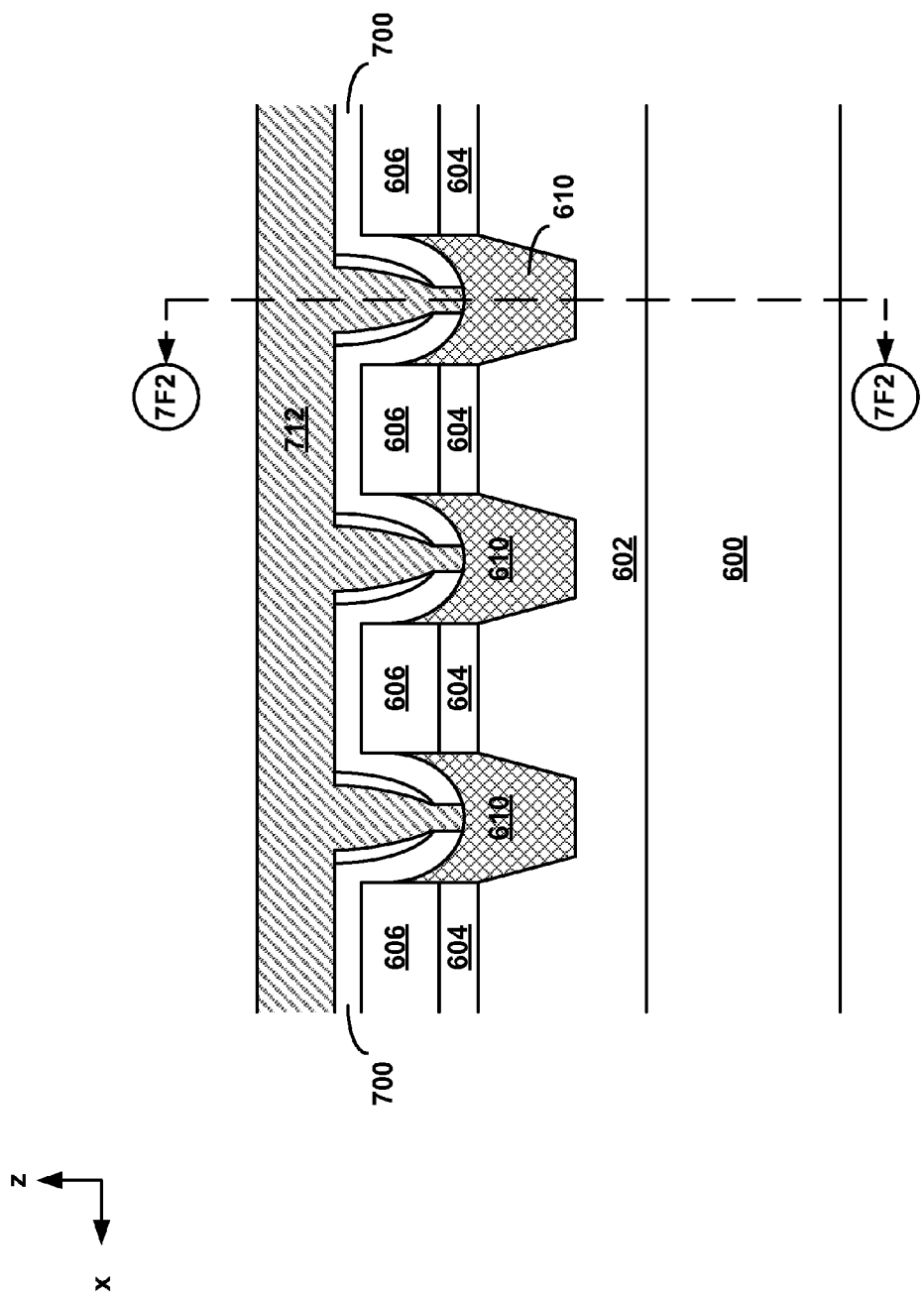
FIG. 7F1

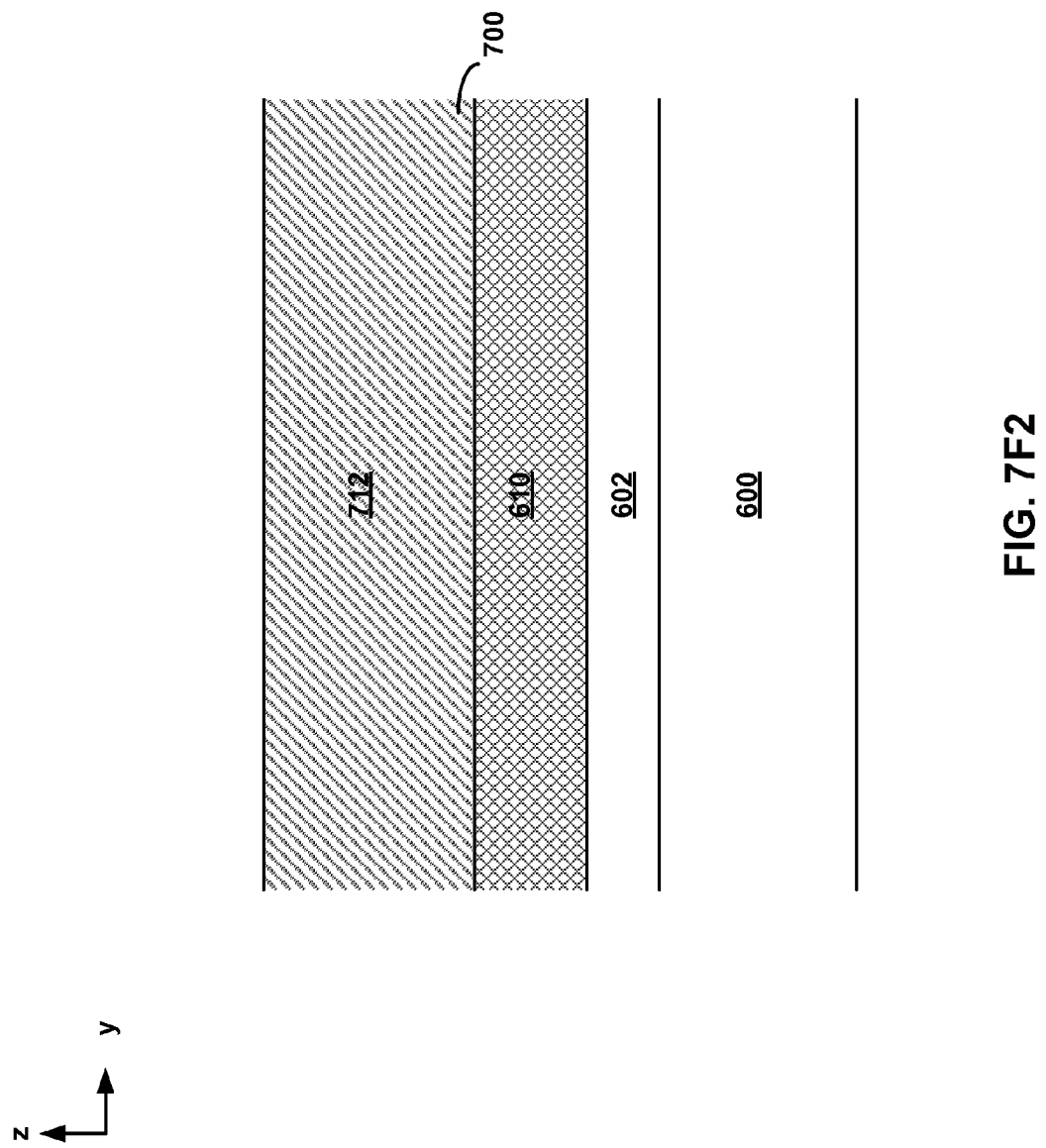
FIG. 7F2

US 9,779,983 B2

METHODS FOR FORMING AIR GAPS IN SHALLOW TRENCH ISOLATION TRENCHES FOR NAND MEMORY

BACKGROUND

Embodiments of the present disclosure are directed to high density semiconductor devices, such as non-volatile memory, and methods of forming the same.

In most integrated circuit applications, the substrate area allocated to implement the various integrated circuit functions continues to decrease. Semiconductor memory devices, for example, and their fabrication processes are continuously evolving to meet demands for increases in the amount of data that can be stored in a given area of the silicon substrate. These demands seek to increase the storage capacity of a given size of memory card or other type of package and/or decrease their size.

Electrical Erasable Programmable Read Only Memory (EEPROM), including flash EEPROM, and Electronically Programmable Read Only Memory (EPROM) are among the most popular non-volatile semiconductor memories. One popular flash EEPROM architecture utilizes a NAND array having a large number of strings of memory cells connected through one or more select transistors between individual bit lines and common source lines. FIG. 1 is a top view showing a single NAND string and FIG. 2 is an equivalent circuit thereof.

The NAND string depicted in FIGS. 1 and 2 includes four transistors 100, 102, 104 and 106 in series between a first select gate 120 and a second select gate 122. Select gate 120 connects the NAND string to a bit line via bit line contact 126. Select gate 122 connects the NAND string to a common source line via source line contact 128. Each of the transistors 100, 102, 104 and 106 is an individual storage element and includes a control gate and a floating gate.

For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, or more.

The charge storage elements of current flash EEPROM arrays are most commonly electrically conductive floating gates, typically formed from a doped polysilicon material, or a double floating gate stack that includes a polysilicon material (doped or undoped) and a metal layer, with a dielectric material separating the metal and polysilicon material layers. Other types of memory cells in flash EEPROM systems can utilize a non-conductive dielectric material in place of a conductive floating gate to form a charge storage element capable of storing charge in a non-volatile manner.

As demands for higher densities in integrated circuit applications have increased, fabrication processes have evolved to reduce the minimum feature sizes of circuit elements such as the gate and channel regions of transistors. Existing fabrication techniques, however, may not be sufficient to fabricate integrated devices these devices.

BRIEF DESCRIPTION OF THE DRAWINGS

FIGS. 5A1-5A3 are various views of a portion of a NAND memory array.

FIGS. 6A1-6K3 are various views of a portion of a substrate during an example fabrication of a flash memory device.

FIGS. 7A1-7F2 are various views of a portion of a substrate during another example fabrication of a flash memory device.

DETAILED DESCRIPTION

Methods of forming a shallow trench isolation trench in a semiconductor substrate is described. One method includes forming a trench in a region of the substrate, forming a first dielectric material in the trench, forming a second dielectric material above the first dielectric material, forming a first air gap in the first dielectric material in the trench, and forming a second air gap in the second dielectric material above the first air gap. Another method includes forming a trench in a region of the substrate, forming a first dielectric material in the trench, forming a second dielectric material above the first dielectric material, forming a first air gap in the first dielectric material in the trench, and removing a portion of the second dielectric material above the first air gap. Without wanting to be bound by any particular theory, it is believed that both methods may reduce the influence of the parasitic capacitance to adjacent memory cells and reduce word line—active area leakage.

Figure 3:
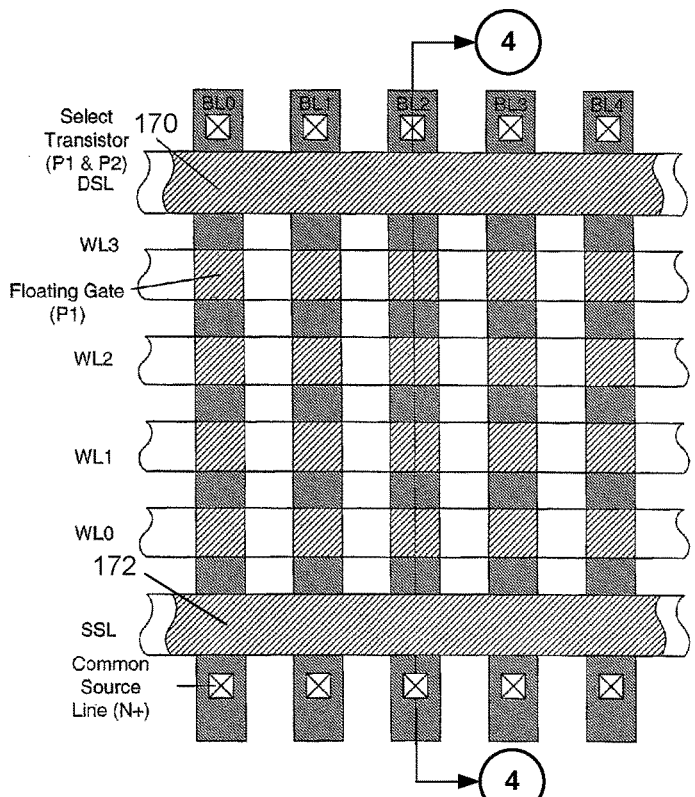
FIG. 3 is a plan view of a portion of a NAND flash memory array.

An example of a type of memory system that can be fabricated in accordance with one embodiment is shown in plan view in FIG. 3. BL0-BL4 represent bit line connections to global vertical metal bit lines (not shown). Four floating gate memory cells are shown in each string by way of example. Typically, the individual strings include 16, 32 or more memory cells, forming a column of memory cells. Control gate (word) lines labeled WL0-WL3 extend across multiple strings over rows of floating gates, often in polysilicon or other conductive material, such as tungsten/tungsten nitride or other conductive material.

Figure 4:
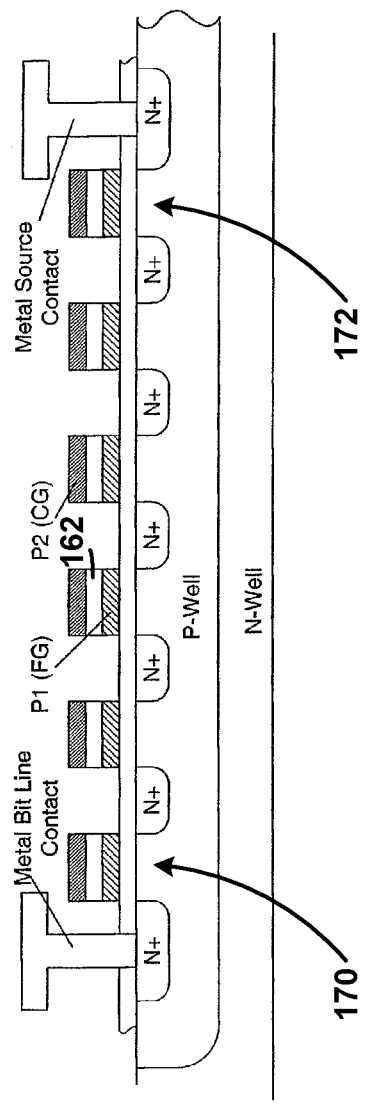
FIG. 4 is an orthogonal cross-sectional view of the portion of the flash memory array depicted in FIG. 3.

FIG. 4 is a cross-sectional view of FIG. 3, depicting layer P2 from which the control gate lines are formed. The control gate lines are typically formed over the floating gates as a self-aligned stack, and are capacitively coupled to the floating gates through an intermediate dielectric layer 162. The top and bottom of the string connect to a bit line and a common source line through select transistors (gates) 170 and 172, respectively. Gate 170 is controlled by selection line DSL and gate 172 is controlled by selection line SSL.

In some embodiments, the floating gate material (P1) optionally can be shorted to the control gate for the select transistors to be used as the active gate. Capacitive coupling between the floating gate and the control gate allows the voltage of the floating gate to be raised by increasing the voltage on the control gate. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, in order to read charge level states along a row of floating gates in parallel.

Figure 1:
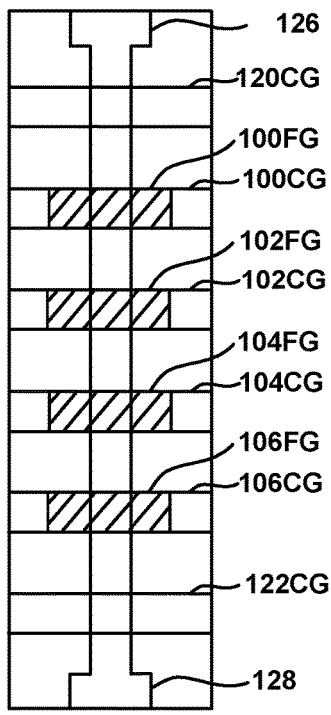
FIG. 1 is a top view of a NAND string.

FIGS. 5A1-5A3 depict various views of an example memory array 500 of NAND strings 502, 504, 506 and 508 that may be fabricated as part of a larger flash memory array. FIGS. 5A-5C depict four memory cells on each of NAND strings 502, 504, 506 and 508 as an example. In particular, NAND string 502 includes memory cells $M_{00}$, $M_{01}$, $M_{02}$, and $M_{03}$, NAND string 504 includes memory cells $M_{10}$, $M_{11}$, $M_{12}$, and $M_{13}$, NAND string 506 includes memory cells $M_{20}$, $M_{21}$, $M_{22}$, and $M_{23}$, and NAND string 508 includes memory cells $M_{30}$, $M_{31}$, $M_{32}$, and $M_{33}$.

Memory array 500 includes word lines WL0, WL2, WL2 and WL3, and floating gates FGa, FGb, . . . , FGp disposed over a semiconductor material region 510 (e.g., a p-well region or an n-well region of a substrate (not shown). In an example embodiment, each of word lines WL0, WL2, WL2 and WL3 may be formed from about 300 angstroms to about 500 angstroms of a tungsten silicide. Other conductive materials and/or thicknesses may be used. In an example embodiment, each of floating gates FGa, FGb, . . . , FGp may be formed from about 500 angstroms to about 700 angstroms of a highly doped semiconductor material. Other conductive materials and/or thicknesses may be used.

Semiconductor material region 510 includes active area regions 512. In an example embodiment, semiconductor material region 510 is a p-well formed in a semiconductor substrate (not shown). The bit line or y-direction runs along the NAND strings, and the word line or x-direction runs perpendicular to the NAND string or the bit line direction. The word line direction also may be referred to as the row direction and the bit line direction referred to as the column direction.

For each of word lines WL0, WL2, WL2 and WL3, a continuous layer of conductive material can be formed across a row to provide a common word line or control gate for each device on that word line. In such a case, this layer forms a control gate for each memory cell at the point where the layer overlaps a corresponding one of floating gates FGa, FGb, . . . , FGp. In the embodiment depicted in FIGS. 5A1-5A3, word line WL0 overlaps floating gates FGa, FGe, FGi and FGm, word line WL1 overlaps floating gates FGb, FGf, FGj and FGn, word line WL2 overlaps floating gates FGc, FGg, FGk and FGo, and word line WL3 overlaps floating gates FGd, FGh, FGl and FGp.

A dielectric layer 514, sometimes referred to as an inter-poly dielectric (IPD), is disposed between word lines WL0, WL1, WL2 and WL3 and floating gates FGa, FGb, . . . , FGo and FGp. In some embodiments, IPD layer 514 may be a single layer of dielectric material, or may be a multi-layer stack of dielectric materials. In other embodiments, individual control gates can be formed and then interconnected by a separately formed word line. In an example embodiment, IPD layer 514 is about 80 angstroms to about 120 angstroms of silicon dioxide. Other dielectric materials and/or thicknesses may be used.

A dielectric layer 516, sometimes referred to as a tunneling oxide, is disposed between floating gates FGa, FGb, . . . , FGo and FGp and active area regions 512 of semiconductor region 510. In some embodiments, dielectric layer 516 may be a single layer of dielectric material, or may be a multi-layer stack of dielectric materials. In an example embodiment, dielectric layer 516 is about 60 angstroms to about 80 angstroms of silicon dioxide. Other dielectric materials and/or thicknesses may be used.

When fabricating a NAND-type non-volatile memory system, including NAND strings as depicted in FIGS. 5A1-5A3, electrical isolation is provided in the word line direction between adjacent NAND strings. In an embodiment, dielectric trenches 518a-518c (e.g., $SiO_2$ shallow trench isolation (STI) trenches) formed in semiconductor region 510 separate NAND strings 502, 504, 506 and 508. In particular, STI trench 518a separates NAND strings 508 and 506, STI trench 518b separates NAND strings 506 and 504, and STI trench 518c separates NAND strings 504 and 502.

In an embodiment, STI trenches 518a-518c include STI air gaps 520a-520c, respectively, disposed between active area regions 512. The presence of STI air gaps 520a-520c may reduce parasitic capacitance between adjacent active area regions 512. Processes for forming STI air gaps 520a-520c are challenging.

In one previously known process, a rapid ion etch process is used to pattern word lines WL0, WL1, WL2 and WL3. As a result, openings are present where the $SiO_2$ of STI trenches 518a-518c is exposed between adjacent word lines. Vapor Phase Cleaning (VPC) using HF acid and wet etching using HF acid are performed through these openings, whereby STI air gaps 520a-520c are formed.

As fabrication processes have evolved to reduce the minimum feature sizes of circuit elements such as the gate and channel regions of transistors, the influence of parasitic capacitance to adjacent memory cells are constantly increasing. Air gaps, such as STI air gaps 520a-520c described above, help reduce parasitic capacitance. But degradation of reliability caused by the influence of parasitic capacitance to adjacent memory cells and the leakage of word line—active area regions is increasing with scaling of memory cell structure is still a problem.

In addition, in the structure shown in FIGS. 5A1-5A3, IPD layer 514, which typically has a high dielectric constant, is disposed above STI air gaps 520a-520c. It has been observed that the existence of a high dielectric constant IPD above STI air gaps, such as STI air gaps 520a-520c, reduces the effect of STI air gaps to suppress cell-to-cell crosstalk.

Methods are described for (1) forming air gaps in a region of IPD layer above STI air gaps, and (2) removing a region of IPD layer above STI air gaps. Without wanting to be bound by any particular theory, it is believed that both methods may reduce the influence of the parasitic capacitance to adjacent memory cells and reduce word line—active area leakage.

Figure 2:
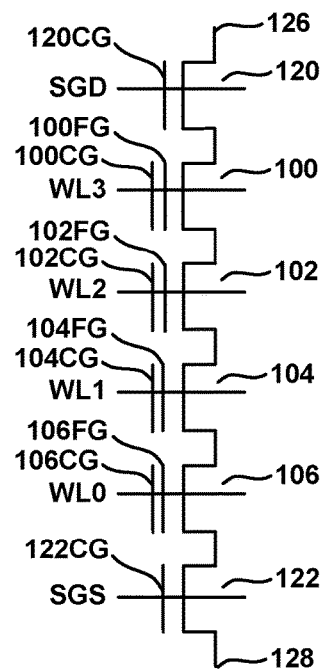
FIG. 2 is an equivalent circuit diagram of the NAND string depicted in FIG. 1.

Referring now to FIGS. 6A1-6K3, an example method for forming IPD air gaps is described. With reference to FIGS. 6A1-6A2, substrate 600 is shown having already undergone several processing steps. Substrate 600 may be any suitable substrate such as a silicon, germanium, silicon-germanium, undoped, doped, bulk, silicon-on-insulator ("SOI") or other substrate with or without additional circuitry. Substrate 600 may include one or more n-well or p-well regions. In an example embodiment, substrate 600 includes a p-well region 602.

A dielectric layer 604, sometimes referred to herein as tunneling oxide layer 604, is formed over p-well region 602. In some embodiments, tunneling oxide layer 604 may be a single layer of dielectric material, or may be a multi-layer stack of dielectric materials. In an example embodiment, tunneling oxide layer 604 is about 60 angstroms to about 80 angstroms of silicon dioxide. Other dielectric materials and/or thicknesses may be used.

A floating gate material layer 606 is formed over tunneling oxide layer 604. In an example embodiment, floating gate material layer 606 may be formed from about 500 angstroms to about 700 angstroms of a highly doped semiconductor material. Example highly doped semiconductor materials include n+ polysilicon having a doping concentration between about $1\times10^{20}$ cm$^{-3}$ and about $1\times10^{22}$ cm$^{-3}$ (referred to herein as "n+ poly"), p+ polysilicon having a doping concentration between about $1\times10^{20}$ cm$^{-3}$ and about $1\times10^{22}$ cm-$^3$ (referred to herein as "p+ poly"), n+ poly with Ge (10-20% Ge), p+ poly with Ge (10-20% Ge), or other similar highly doped semiconductor materials. Persons of ordinary skill in the art will understand that other semiconductor materials, doping types and doping concentrations may be used. Other conductive materials and/or thicknesses may be used.

Floating gate material layer 606, tunneling oxide layer 604, and p-well region 602 are patterned and etched to form trenches 608, resulting in the structure shown in FIGS. 6B1-6B3. As described below, trenches 608 will be used to from STI trenches in p-well region 602. In an embodiment, floating gate material layer 606, tunneling oxide layer 604, and p-well region 602 may be patterned and etched using conventional lithography techniques, with a soft or hard mask, and wet or dry etch processing. Floating gate material layer 606, tunneling oxide layer 604, and p-well region 602 may be patterned and etched in a single pattern/etch procedure or using separate pattern/etch steps.

For example, photoresist may be deposited, patterned using standard photolithography techniques, layers 606, 604 and 602 may be etched, and then the photoresist may be removed. Alternatively, a hard mask of some other material, for example silicon dioxide, may be formed on top of floating gate material layer 606, with bottom antireflective coating ("BARC") on top, then patterned and etched. Similarly, dielectric antireflective coating ("DARC") and/or amorphous carbon film (e.g., the Advanced Patterning Film from Applied Materials, Santa Clara, Calif.) may be used as a hard mask.

Any suitable masking and etching process may be used to form trenches 608. For example, layers 606, 604 and 602 may be patterned with about 1 to about 1.5 micron, more preferably about 1.2 to about 1.4 micron, of photoresist ("PR") using standard photolithographic techniques. Thinner PR layers may be used with smaller critical dimensions and technology nodes. In some embodiments, an oxide hard mask may be used below the PR layer to improve pattern transfer and protect underlying layers during etching.

A first dielectric material layer 610 is formed over substrate 600, filling trenches 608, resulting in the structure shown in FIGS. 6C1-6C2. For example, between about 2000 angstroms to about 4000 angstroms of a polysilazane (PSZ) may be coated at room temperature, followed by a baking treatment between about 100° C. to about 350° C. A PSZ (silazane-based polymer) is a material having a polymeric chain structure based on alternating silicon and nitrogen atoms. Polysilazanes have both linear, cyclic, and fused cyclic chain segments. Other dielectric materials may be used, such as a spin-on-glass (SOG) polymer, methyl silsesquioxane (MSQ), hydrogen silsesquioxane (HSQ), or other similar material, and other material layer thicknesses may be used. For simplicity, first dielectric material 610 will also be referred to herein as first PSZ layer 610.

First PSZ layer 610 is etched back using a dry etch, resulting in the structure shown in FIGS. 6D1-6D4. In particular, as depicted in FIGS. 6D1-6D4, p-well region 602 includes STI trenches 611, each of which includes the etched first PSZ layer 610 in trenches 608. Other etch processes may be used.

A second dielectric material 612 is deposited over substrate 600, resulting in the structure shown in FIGS. 6E1-6E2. For example, between about 80 angstroms to about 120 angstroms of silicon dioxide may be deposited. Second dielectric material layer 612 may be formed by chemical vapor deposition (CVD), atomic layer deposition (ALD), or other similar process. Other dielectric materials such as silicon nitride, silicon oxynitride, etc., and/or other dielectric material layer thicknesses may be used.

An etch process, such as a rapid ion etch (RIE), is used to form recess portions 614 in portions of second dielectric material inside trenches 608, resulting in the structure shown in FIGS. 6F1-6F3. Recess portions 614 may have a width of between about 10 angstroms and about 20 angstroms, and a depth of between about 10 angstroms and about 15 angstroms, although other dimensions may be used. Although recess portions 614 are shown in FIGS. 6F1-6F3 having a rectangular shape, other shapes may be used.

A third dielectric material layer 616 is formed over substrate 600, filling trenches 608 and recess portions 614, resulting in the structure shown in FIGS. 6G1-6G2. For example, between about 2000 angstroms to about 4000 angstroms of a PSZ may be coated at room temperature, followed by a baking treatment between about 100° C. to about 350° C. Other dielectric materials may be used, such as an SOG polymer, MSQ, HSQ, or other similar material, and other material layer thicknesses may be used. For simplicity, third dielectric material 616 will also be referred to herein as second PSZ layer 616.

Second PSZ layer 616 is etched back using a dry etch, resulting in the structure shown in FIGS. 6H1-6H3. In particular, as depicted in FIGS. 6H1-6H3, each of trenches 608 includes the etched second PSZ layer 616 in recess portions 614. Other etch processes may be used.

A fourth dielectric material layer 618 is formed over substrate 600, filling trenches 608. For example, between about 80 angstroms to about 120 angstroms of silicon dioxide may be deposited. Fourth dielectric material layer 618 may be formed by CVD, ALD, or other similar process. Other dielectric materials such as silicon nitride, silicon oxynitride, etc., and/or other dielectric material layer thicknesses may be used. Second dielectric material 612 and fourth dielectric material layer 618 are sometimes collectively referred to as an IPD layer. Thus, as used herein, second dielectric material layer 612 is also referred to as IPD layer 612 and fourth dielectric material layer 618 is also referred to as IPD layer 618.

A conductive layer 620 is deposited over IPD layer 618. In an example embodiment, conductive layer 620 may include any conductive material such as tungsten silicide or another appropriate metal, heavily doped semiconductor material, a conductive silicide, a conductive silicide-germanide, a conductive germanide, or the like deposited by any suitable method (e.g., CVD, physical vapor deposition (PVD), etc.).

In at least one embodiment, conductive layer 620 may comprise between about 200 angstroms and about 1000 angstroms of tungsten silicide. Other conductive layer materials and/or thicknesses may be used. In some embodiments, an adhesion layer, such as titanium nitride or other similar adhesion layer material (not shown), may be disposed between IPD layer 618 and conductive layer 620. Persons of ordinary skill in the art will understand that adhesion layers may be formed by PVD or another method.

Conductive layer 620, IPD layer 618, IPD layer 612, second PSZ layer 616, floating gate material layer 606, and tunneling oxide layer 604 are patterned and etched to form etched rows 622, resulting in the structure shown in FIG. 6I1-6I3. For example, conductive layer 620, IPD layer 618, IPD layer 612, second PSZ layer 616, floating gate material layer 606, and tunneling oxide layer 604 may be patterned and etched using conventional lithography techniques, with a soft or hard mask, and wet or dry etch processing. In at least one embodiment, conductive layer 620, IPD layer 618, IPD layer 612, second PSZ layer 616, floating gate material layer 606, and tunneling oxide layer 604 are patterned and etched to form substantially parallel, substantially co-planar word lines WL0-WL3, and floating gates FGa-FGp. Example widths for word lines WL0-WL3 and/or spacings between word lines WL0-WL3 range between about 100 and about 2500 angstroms, although other conductor widths and/or spacings may be used. As shown in FIGS. 6I2 and 6I3, the etch exposes portions 624 of a top surface of first PSZ layer 610 between etched rows 622.

Conductive layer 620, IPD layer 618, IPD layer 612, second PSZ layer 616, floating gate material layer 606, and tunneling oxide layer 604 may be patterned and etched in a single pattern/etch procedure or using separate pattern/etch steps. For example, photoresist may be deposited, patterned using standard photolithography techniques, layers 620, 618, 612, 616, 606 and 604 may be etched, and then the photoresist may be removed. Alternatively, a hard mask of some other material, for example silicon dioxide, may be formed on top of conductive layer 620, with BARC on top, then patterned and etched. Similarly, DARC and/or amorphous carbon film (e.g., the Advanced Patterning Film from Applied Materials, Santa Clara, Calif.) may be used as a hard mask.

Any suitable masking and etching process may be used to form etched rows 622. For example, layers 620, 618, 612, 616, 606 and 604 may be patterned with about 1 to about 1.5 micron, more preferably about 1.2 to about 1.4 micron, of PR using standard photolithographic techniques. Thinner PR layers may be used with smaller critical dimensions and technology nodes. In some embodiments, an oxide hard mask may be used below the PR layer to improve pattern transfer and protect underlying layers during etching.

Exposed portions of second PSZ layer 616 and exposed portions 624 of a top surface of first PSZ layer 610 are then isotropically etched. For example, VPC using HF acid and/or wet etching using HF acid may be used to isotropically etch exposed portions 616 and 624. Such VPC and/or wet etching may be performed in any suitable tool, such as single wafer cleaner SU-3200, available from SCREEN Semiconductor Solutions, Co., Ltd., Kyoto Japan Example post-etch cleaning may include using ultra-dilute sulfuric acid. Megasonics may or may not be used. Other clean chemistries, times and/or techniques may be employed.

As a result of isotropically etching exposed portions 616 and 624, first air gaps 626 are formed in STI trenches 611, and second air gaps 628 are formed in IPD layer 612, resulting in the structure shown in FIGS. 6J1-6J3. As depicted in FIG. 6J1, second air gaps 628 are disposed in IPD layer 612 above first air gaps 626, which are disposed in STI trenches 611 between active areas 629 of p-well region 602.

Without wanting to be bound by any particular theory, it is believed that second (IPD) air gaps 628 may reduce the influence of the parasitic capacitance to adjacent memory cells and reduce word line—active area leakage.

A fourth dielectric material layer 630 is formed over substrate 600 to fill the voids between etched rows 622. For example, approximately 3000-7000 angstroms of silicon dioxide may be deposited on substrate 600 and planarized using chemical mechanical polishing or an etchback process to form a planar surface 632, resulting in the structure shown in FIGS. 6K1-6K3. Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

In another implementation, instead of forming an IPD air gap above STI air gaps, a portion of IPD layer material above each STI air gap may be removed. Referring now to FIGS. 7A1-7F2, an example method for removing IPD regions above air gaps is described. With reference to FIGS. 7A1-7A2, substrate 600 is shown having already undergone several processing steps, such as processing steps 6A1-6D4, described above.

A dielectric material 700 is deposited over substrate 600, resulting in the structure shown in FIGS. 7A1-7A2. For example, between about 80 angstroms to about 120 angstroms of silicon dioxide may be deposited. Dielectric material layer 700 may be formed by CVD, ALD, or other similar process. Other dielectric materials such as silicon nitride, silicon oxynitride, etc., and/or other dielectric material layer thicknesses may be used. Dielectric material 700 is sometimes referred to as an IPD layer. Thus, as used herein, dielectric material 700 is also referred to as IPD layer 700.

A polysilicon layer 702 is deposited over substrate 600, resulting in the structure shown in FIGS. 7B1-7B2. For example, between about 150 angstroms to about 250 angstroms of polysilicon may be deposited. CVD or another suitable process may be employed to deposit polysilicon layer 702.

An anisotropic etch is used to remove lateral portions of polysilicon layer 702, leaving only sidewall portions 704 of polysilicon material on sides of IPD layer 700, resulting in the structure shown in FIGS. 7C1-7C2. Sidewall portions 704 form sidewall liners, and are referred to herein as sidewall liners 704.

A silicon nitride material layer 706 is deposited over substrate 600, resulting in the structure shown in FIGS. 7D1-7D2. For example, between about 10 angstroms to about 20 angstroms of silicon nitride material may be deposited. CVD or another suitable process may be employed to deposit silicon nitride material layer 706. Small indentations or dimples 708 may be formed in silicon nitride material layer 706 above cavities 709.

An etch is used to remove silicon nitride material layer 706 and bottom portions of IPD layer 700 inside cavities 709, leaving gap regions 710 above first PSZ layer 610, resulting in the structure shown in FIGS. 7E1-7E2. Gap regions 710 may have a width of between about 10 angstroms and about 20 angstroms, and a depth of between about 10 angstroms and about 20 angstroms, although other dimensions may be used. Although gap regions 710 are shown in FIGS. 7E1-7E2 having a rectangular shape, other shapes may be used.

A conductive layer 712 is deposited over substrate 600, filling cavities 709 and gap regions 710, resulting in the structure shown in FIGS. 7F1-7F2. In an example embodiment, conductive layer 712 may include any conductive material such as tungsten silicide or another appropriate metal, heavily doped semiconductor material, a conductive silicide, a conductive silicide-germanide, a conductive germanide, or the like deposited by any suitable method (e.g., CVD, physical vapor deposition (PVD), etc.).

In at least one embodiment, conductive layer 712 may comprise between about 200 angstroms and about 1000 angstroms of tungsten silicide. Other conductive layer materials and/or thicknesses may be used. In some embodiments, an adhesion layer, such as titanium nitride or other similar adhesion layer material (not shown), may be disposed between IPD layer 700 and conductive layer 712. Persons of ordinary skill in the art will understand that adhesion layers may be formed by PVD or another method.

Processing may continue as described above in connection with FIGS. 6I1-6K3 to form word lines, and STI air gaps 628 in first PSZ layer 610 in trenches 608. As a result of the process described above in connection with FIGS. 7A1-7F2, gap regions 710 of IPD layer 700 above STI air gaps 628 are removed. Without wanting to be bound by any particular theory, it is believed that removing gap regions 710 of IPD layer 700 above STI air gaps 628 may reduce the influence of the parasitic capacitance to adjacent memory cells and reduce word line—active area leakage.

Figure 8:
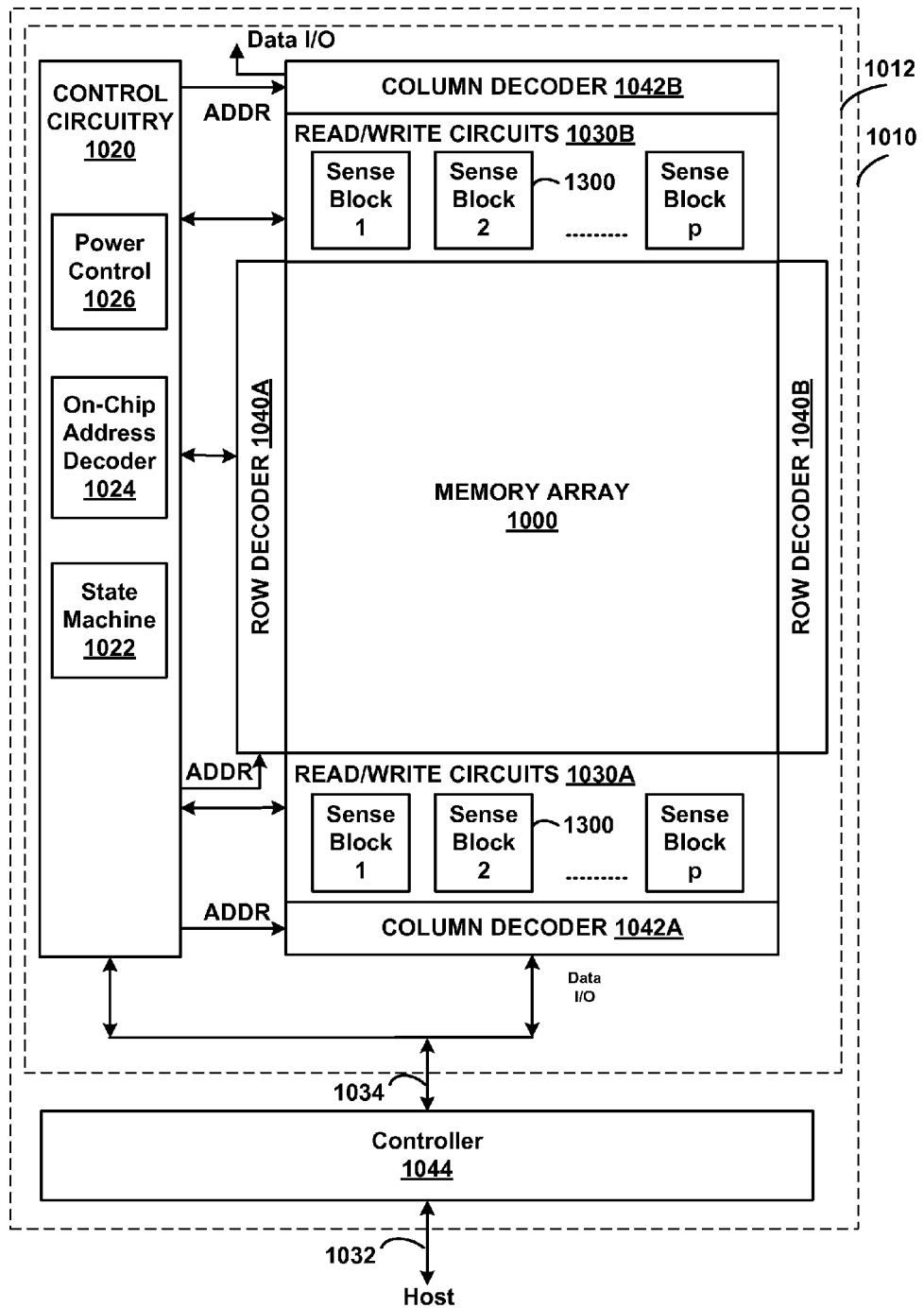
FIG. 8 is a block diagram depicting an example of a memory system.

FIG. 8 illustrates a non-volatile storage device 1010 that may include one or more memory die or chips 1012. Memory die 1012 includes an array (two-dimensional or three dimensional) of memory cells 1000, control circuitry 1020, and read/write circuits 1030A and 1030B. In one embodiment, access to the memory array 1000 by the various peripheral circuits is implemented in a symmetric fashion, on opposite sides of the array, so that the densities of access lines and circuitry on each side are reduced by half. The read/write circuits 1030A and 1030B include multiple sense blocks 1300 which allow a page of memory cells to be read or programmed in parallel. The memory array 1000 is addressable by word lines via row decoders 1040A and 1040B and by bit lines via column decoders 1042A and 1042B. In a typical embodiment, a controller 1044 is included in the same memory device 1010 (e.g., a removable storage card or package) as the one or more memory die 1012. Commands and data are transferred between the host and controller 1044 via lines 1032 and between the controller and the one or more memory die 1012 via lines 1034. One implementation can include multiple chips 1012.

Control circuitry 1020 cooperates with the read/write circuits 1030A and 1030B to perform memory operations on the memory array 1000. The control circuitry 1020 includes a state machine 1022, an on-chip address decoder 1024 and a power control module 1026. The state machine 1022 provides chip-level control of memory operations. The on-chip address decoder 1024 provides an address interface to convert between the address that is used by the host or a memory controller to the hardware address used by the decoders 1040A, 1040B, 1042A, and 1042B. The power control module 1026 controls the power and voltages supplied to the word lines and bit lines during memory operations. In one embodiment, power control module 1026 includes one or more charge pumps that can create voltages larger than the supply voltage.

In one embodiment, one or any combination of control circuitry 1020, power control circuit 1026, decoder circuit 1024, state machine circuit 1022, decoder circuit 1042A, decoder circuit 1042B, decoder circuit 1040A, decoder circuit 1040B, read/write circuits 1030A, read/write circuits 1030B, and/or controller 1044 can be referred to as one or more managing circuits.

In one embodiment, an array of memory cells 1000 is divided into a large number of blocks (e.g., blocks 0-1023, or another amount) of memory cells. As is common for flash EEPROM systems, the block is the unit of erase. That is, each block contains the minimum number of memory cells that are erased together. Other units of erase can also be used. A block contains a set of NAND strings which are accessed via bit lines and word lines. Typically, all of the NAND strings in a block share a common set of word lines.

Each block is typically divided into a number of pages. In one embodiment, a page is a unit of programming. Other units of programming can also be used. One or more pages of data are typically stored in one row of memory cells. For example, one or more pages of data may be stored in memory cells connected to a common word line. Thus, in one embodiment, the set of memory cells that are connected to a common word line are programmed simultaneously. A page can store one or more sectors. A sector includes user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages and sectors can also be used.

Various features and techniques have been presented with respect to the NAND flash memory architecture. It will be appreciated from the provided disclosure that implementations of the disclosed technology are not so limited. By way of non-limiting example, embodiments in accordance with the present disclosure can provide and be used in the fabrication of a wide range of semiconductor devices, including but not limited to logic arrays, volatile memory arrays including SRAM and DRAM, and non-volatile memory arrays including both the NOR and NAND architecture.

One embodiment includes a method of forming a shallow trench isolation trench in a semiconductor substrate. The method includes forming a trench in a region of the substrate, forming a first dielectric material in the trench, forming a second dielectric material above the first dielectric material, forming a first air gap in the first dielectric material in the trench, and forming a second air gap in the second dielectric material above the first air gap.

One embodiment includes a NAND memory array that includes a semiconductor substrate, a shallow trench isolation trench in a region of the substrate, a first dielectric material in the shallow trench isolation trench, a second dielectric material disposed above the first dielectric material, a first air gap in the first dielectric material in the shallow trench isolation trench, and a second air gap in the second dielectric material above the first air gap.

One embodiment includes a method of forming a shallow trench isolation trench in a semiconductor substrate. The method includes forming a trench in a region of the substrate, forming a first dielectric material in the trench, forming a second dielectric material above the first dielectric material, forming a first air gap in the first dielectric material in the trench, and removing a portion of the second dielectric material above the first air gap.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

The invention claimed is:

1. A method of forming a shallow trench isolation trench in a semiconductor substrate, the method comprising:
   forming a trench in a region of the substrate;
   forming a first dielectric material in the trench;
   forming a second dielectric material in the trench on and above the first dielectric material;
   forming a third dielectric material in a portion of the second dielectric material;
   forming a first air gap in the first dielectric material in the trench; and
   etching the third dielectric material to form a second air gap in the second dielectric material above the first air gap.

2. The method of claim 1, wherein the region comprises an n-well or a p-well.

3. The method of claim 1, wherein the region comprises an active area region of the substrate.

4. The method of claim 1, wherein the first dielectric material comprises one or more of a polysilazane, a spin-on-glass (SOG) polymer, methyl silsesquioxane (MSQ), and hydrogen silsesquioxane (HSQ).

5. The method of claim 1, wherein forming the first dielectric material comprises depositing a polysilazane at room temperature, followed by a baking treatment between about 100° C. to about 350° C.

6. The method of claim 1, wherein the second dielectric material comprises one or more of silicon dioxide, silicon nitride, silicon oxynitride, and a low K dielectric.

7. The method of claim 1, wherein the second dielectric material comprises an inter-poly dielectric material.

8. A method of forming a shallow trench isolation trench in a semiconductor substrate, the method comprising:
   forming a trench in a region of the substrate;
   forming a first dielectric material in the trench;
   forming a second dielectric material above the first dielectric material;
   removing a portion of the second dielectric material to expose an upper surface of the first dielectric material and form a gap region in the second dielectric material;
   forming a conductive material in the gap region; and
   forming an air gap in the first dielectric material in the trench, the air gap disposed beneath the gap region.

9. The method of claim 8, wherein the region comprises an n-well or a p-well.

10. The method of claim 8, wherein the region comprises an active area region of the substrate.

11. The method of claim 8, wherein the first dielectric material comprises one or more of a polysilazane, a spin-on-glass (SOG) polymer, methyl silsesquioxane (MSQ), and hydrogen silsesquioxane (HSQ).

12. The method of claim 8, wherein forming the first dielectric material comprises depositing a polysilazane at room temperature, followed by a baking treatment between about 100° C. to about 350° C.

13. The method of claim 8, wherein the second dielectric material comprises one or more of silicon dioxide, silicon nitride, silicon oxynitride, and a low K dielectric.

14. The method of claim 8, wherein the second dielectric material comprises an inter-poly dielectric material.

* * * * *